United States Patent
Mino et al.

(10) Patent No.: US 8,084,301 B2
(45) Date of Patent: Dec. 27, 2011

(54) RESIN SHEET, CIRCUIT DEVICE AND METHOD OF MANUFACTURING THE SAME

(75) Inventors: Katsuyoshi Mino, Ota (JP); Masaru Kanakubo, Ota (JP); Masami Motegi, Oizumi-machi (JP)

(73) Assignees: SANYO Electric Co., Ltd., Moriguchi-shi (JP); SANYO Semiconductor Co., Ltd., Ora-gun (JP)

( * ) Notice: Subject to any disclaimer, the term of this patent is extended or adjusted under 35 U.S.C. 154(b) by 145 days.

(21) Appl. No.: 12/557,882

(22) Filed: Sep. 11, 2009

(65) Prior Publication Data

US 2010/0065960 A1    Mar. 18, 2010

(30) Foreign Application Priority Data

| Sep. 11, 2008 | (JP) | 2008-233781 |
| Sep. 29, 2008 | (JP) | 2008-250910 |
| Sep. 29, 2008 | (JP) | 2008-250912 |

(51) Int. Cl.
*H01L 21/44* (2006.01)
*H01L 21/48* (2006.01)

(52) U.S. Cl. .. 438/126; 438/112; 438/127; 257/E21.504

(58) Field of Classification Search ............ 438/126, 438/127, 112; 257/702, 787, E21.504
See application file for complete search history.

(56) References Cited

U.S. PATENT DOCUMENTS

| 5,304,512 | A | 4/1994 | Arai et al. | |
| 6,832,704 | B2 * | 12/2004 | Smith | 222/402.1 |
| 7,371,608 | B2 * | 5/2008 | Tan et al. | 438/109 |
| 7,855,464 | B2 * | 12/2010 | Shikano | 257/786 |
| 7,867,828 | B2 * | 1/2011 | Jobetto | 438/126 |
| 2004/0099943 | A1 * | 5/2004 | Meguro et al. | 257/701 |
| 2005/0001331 | A1 * | 1/2005 | Kojima et al. | 257/778 |
| 2006/0216867 | A1 * | 9/2006 | Kawata et al. | 438/124 |
| 2008/0211086 | A1 * | 9/2008 | Morita | 257/702 |
| 2009/0026604 | A1 * | 1/2009 | Shin et al. | 257/702 |
| 2009/0152714 | A1 * | 6/2009 | Yamagishi et al. | 257/724 |
| 2009/0211086 | A1 * | 8/2009 | Aoki et al. | 29/832 |

FOREIGN PATENT DOCUMENTS

| JP | 2-175107 | 7/1990 |
| JP | 9-64049 | 3/1997 |
| JP | 11-340257 | 12/1999 |
| JP | 3316449 | 6/2002 |

* cited by examiner

*Primary Examiner* — Nitin Parekh
(74) *Attorney, Agent, or Firm* — Morrison & Foerster LLP

(57) ABSTRACT

Provided is a circuit device manufacturing method for coating a bottom surface of a circuit board with a thin coating of sealing resin. In the present invention, a circuit board having a circuit element such as a semiconductor element embedded therein is placed in a molding die, and a resin sheet containing a thermosetting resin is interposed between the circuit board and a bottom surface of an inner wall of the molding die. Under this condition, the molding die is heated to about 180° C., and a sealing resin in liquid form is injected through a gate. Thereby, the bottom surface of the circuit board can be coated with a thin coating of the sealing resin made of the molten resin sheet.

18 Claims, 21 Drawing Sheets

RESIN SHEET, CIRCUIT DEVICE AND METHOD OF MANUFACTURING THE SAME

This application claims priority from Japanese Patent Application Number JP 2008-233781 filed on Sep. 11, 2008, Japanese Patent Application Number JP 2008-250912 filed on Sep. 29, 2008, and Japanese Patent Application Number JP 2008-250910 filed on Sep. 29, 2008, the contents of which are incorporated herein by reference in their entirety.

BACKGROUND OF THE INVENTION

1. Field of the Invention

The present invention relates to a circuit device manufacturing method, and particularly to a circuit device manufacturing method in which an entire circuit board of a relatively large size, inclusive of its bottom surface, is sealed by resin. More particularly, the present invention relates to a resin sheet and a circuit device manufacturing method using the resin sheet. Still more particularly, the present invention relates to a circuit device in which a principal surface of a semiconductor element is coated with a thin coating of sealing resin, and a method of manufacturing the same.

2. Description of the Related Art

Methods for sealing a circuit board having a hybrid integrated circuit formed of a transistor or a chip element, embedded therein on a top surface of the hybrid integrated circuit, include a sealing method using a casing member, and a resin sealing method using resin.

With the use of the casing member, the casing member in the form of lid having a hollow portion is fitted to the circuit board, whereby the hybrid integrated circuit formed on the top surface of the circuit board is housed in the hollow portion of the casing member.

With the adoption of the resin sealing, injection molding using a molding die is employed to apply a coating to the hybrid integrated circuit formed on the top surface of the circuit board. Description will be given with reference to FIG. 19A with regard to a configuration of a resin-sealed hybrid integrated circuit device 400. In the hybrid integrated circuit device 400, first, the top surface of a circuit board 401 made of metal such as aluminum is wholly coated with an insulating layer 402. Then, a circuit element is connected to a conductive pattern 403 formed on the top surface of the insulating layer 402 thereby to form a predetermined hybrid integrated circuit. A semiconductor element 405A and a chip element 405B connected together by a fine metal wire 407 are depicted as the elements arranged on the top surface of the circuit board 401. At each end of the circuit board 401, a lead 404 is fixed to the conductive pattern 403 in the form of pad.

A sealing resin 406 is a thermoplastic resin, and coats the top, side and bottom surfaces of the circuit board 401. Here, a reduction in the thickness of the sealing resin 406 coating the bottom surface of the circuit board 401 is effective for good outward radiation of heat via the circuit board 401, the heat produced by the circuit element formed on the top surface of the circuit board 401. However, if the thickness of the sealing resin 406 coating the bottom surface of the circuit board 401 is set thin, for example on the order of 0.5 mm, there arises the problem that the bottom surface of the circuit board 401, in part, is not coated with the sealing resin 406. The reason is that in a process for injection-molding the sealing resin 406 by use of a molding die, a gap between the bottom surface of the circuit board 401 and the bottom surface of an inner wall of the molding die is so narrow that sealing resin does not spread well throughout the gap.

A method for avoiding this problem will be described with reference to FIG. 19B. Here, the injection molding takes place with the circuit board 401 supported from underneath by a supporting member 410. Specifically, the supporting member 410 is made of a thermoplastic resin, and its inside surface is of such a size as to fit to the bottom surface and part of the side surfaces of the circuit board 401. Also, an outside surface of the supporting member 410 is of such a size as to come in contact with the bottom and side surfaces of the inner wall of a molding die 412. Thus, when the circuit board 401 supported by the supporting member 410 is placed in a cavity 414 of the molding die 412, the supporting member 410 is situated in the gap between the bottom surface of the circuit board 401 and the bottom surface of the inner wall of the molding die 412. Under this condition, the thermoplastic resin is injected into the cavity 414 thereby to provide the resin sealing for the circuit board 401. According to this method, the supporting member 410 is situated in the gap between the bottom surface of the circuit board 401 and the bottom surface of the inner wall of the molding die 412, and thus, there is no need for injection of a thermosetting resin in liquid form into the gap, which in turn prevents the occurrence of a void resulting from the bottom surface of the circuit board 401 being in a partially uncoated state. Also, a potting resin 420 is formed on the top surface of the circuit board 401 so as to coat the circuit element, for the purpose of protecting the fine metal wire or the like against injection pressure at the time of the resin sealing.

A resin sealing method for a semiconductor device of a lead frame type will be described with reference to FIGS. 20A and 20B. FIG. 20A is a cross-sectional view showing a resin sealing process, and FIG. 20B is a cross-sectional view showing a configuration of a circuit device 500 as manufactured.

Referring to FIG. 20A, an island 502 having a semiconductor element 504 fixed on a top surface thereof is placed within a cavity 514 formed by bringing an upper die 524 and a lower die 526 into contact with each other. Also, a pod 520 that communicates with the cavity 514 via a runner 518 is formed in the lower die 526, and a tablet 528 is placed in the pod 520. The tablet 528 is formed by pressure-molding a granular thermosetting resin, filler and the like, and has a cylindrical shape.

The above-mentioned molding die is heated to or above a temperature at which the tablet 528 placed in the pod 520 melts, and thus, the tablet 528 placed in the pod 520 is gradually melted into a sealing resin in liquid form. Then, the sealing resin in the liquid form pressed by a plunger 522 is fed to the cavity 514 via the runner 518 and a gate 516, and the semiconductor element 504 and the island 502 are sealed by the sealing resin. Also, with injection of the sealing resin, air in the cavity 514 is released to the outside through an air vent 556.

FIG. 20B shows the circuit device 500 resin-sealed by the above-mentioned process. A sealing resin 508 is used to resin-seal the island 502, the semiconductor element 504, a fine metal wire 506 and a lead 510. Also, the back surface of the island 502 is wholly coated with the sealing resin 508 in order to ensure pressure resistance and moisture resistance.

Nowadays, as electronic equipment such as a mobile telephone becomes smaller in size and becomes more multifunctional, a circuit device for use in such equipment is likewise desired to become still smaller in size.

A packaging structure for a highly integrated circuit element has shifted from conventional quad flat package (QFP) to chip size package (CSP) or wafer level package (WLP). With the CSP, the package is formed by dicing a wafer having external connection electrodes formed on one principal surface. Thus, the CSP is fixable, in size equivalent to the circuit element, to a packaging board, which in turn enables miniaturization of the packaging board on which the CSP is mounted. Hence, the adoption of the CSP also enables miniaturization of a whole set such as the mobile telephone.

A circuit device 600 of a conventional CSP type will be described with reference to FIG. 21. The circuit device 600 includes a circuit element 601 made of a semiconductor substrate having a diffusion region formed on a top surface, a protective film 602 coating the top surface of the circuit element 601, and an external electrode 607. An electrode 604 is a metal film formed in an opening formed by partially removing the protective film 602, and is connected to the diffusion region formed on the circuit element 601. The external electrode 607 is a bump electrode made of gold or a solder ball made of solder, and is fixed on the top surface of the electrode 604. A PSG (phospho-silicate-glass) film, a $Si_3N_4$ (silicon nitride) film, or the like is used as the protective film.

Referring to FIGS. 19A and 19B, methods for forming a sealing resin using a molding die include transfer molding besides the above-mentioned injection molding, and the transfer molding uses a thermosetting resin such as an epoxy resin to coat the top, side and bottom surfaces of the circuit board 401. In recent years, the transfer molding has come into more frequent use than the injection molding. The reason is that the transfer molding enables resin sealing at a lower temperature with lower pressure, and hence causes less adverse influence on a circuit element such as a semiconductor element, than the injection molding.

The transfer molding also uses the molding die 412 as shown in FIG. 19B for resin sealing. Therefore, a reduction in the thickness of the sealing resin 406 coating the bottom surface of the circuit board 401 may lead to the problem that the sealing resin is not filled into the gap between the bottom surface of the inner wall of the molding die 412 and the bottom surface of the circuit board 401. In addition, the injection molding uses a thermoplastic resin such as polyphenylene sulfide (PPS) for resin sealing of the circuit board 401. Therefore, it is difficult to apply the technology related to the injection molding to the transfer molding without any modification because of great variation in property between the thermoplastic resin used in the injection molding and the thermosetting resin used in the transfer molding.

Referring to FIGS. 20A and 20B, further, the above-mentioned sealing method poses the problem that the bottom surface of the island 502 is not coated. Specifically, a reduction in the thickness of the sealing resin 508 coating the bottom surface of the island 502 is desirable for good outward radiation of heat produced by the semiconductor element 504 via the island 502 and the sealing resin 508. A reduction in the thickness of the sealing resin 508 coating the bottom surface of the island 502 to about 0.5 mm or less, for example, achieves an improvement in heat radiation characteristics of the whole device. To this end, however, a gap between the bottom surface of the island 502 and an inner wall of the lower die 526 needs to be set narrow in the resin sealing process as shown in FIG. 20A, and such a narrow gap may not allow the sealing resin to be fully filled into the gap. If there is an unfilled region that is not filled with the sealing resin, the region forms a void, thus causing the occurrence of a defective condition.

In this regard, an increase in pressure applied to the sealing resin, at the time of injection of the sealing resin into the cavity 514, may possibly permit the filling of the sealing resin into the narrow gap under the island 502. However, the increase in the injection pressure exerted on the sealing resin can possibly cause the breaking of the fine metal wire 506 having a fine diameter on the order of a few tens of micrometers.

Referring to FIG. 21, further, the circuit device 600 of the above-mentioned configuration poses the problem that the circuit element 601 made of a semiconductor material such as silicon may have a crack in a process for transporting the circuit device 600 or in a process for mounting the circuit device 600 because the bottom surface of the circuit element 601 is exposed to the outside.

The problem of the occurrence of a crack in the circuit element 601 as mentioned above is relieved by coating the bottom surface of the circuit element 601 with a protective film such as resin. For this purpose, a protective film may be formed on the bottom surface of the circuit element 601 by using a coating method such as potting. In this case, however, the formation of a thin and even coating as this protective film is difficult. The formation of a thick coating of the protective film leads to the problem of increasing the thickness of the circuit device 600 as a whole, or the formation of an uneven coating of the protective film leads to the problem of impairing evenness of the circuit device 600.

An object of the present invention is to provide a circuit device manufacturing method which includes: integrally sealing a circuit board with a sealing resin made of a thermosetting resin; and coating the bottom surface of the circuit board with a thin coating of the sealing resin. Another object of the present invention is to provide a resin sheet and a circuit device manufacturing method using the resin sheet, the resin sheet allowing prevention of occurrence of a void at the time of resin sealing. Still another object of the present invention is to provide a circuit device manufacturing method capable of coating a principal surface of a circuit element with an extremely thin and even coating of resin.

SUMMARY OF THE INVENTION

A circuit device manufacturing method of the present invention includes the steps of: embedding a hybrid integrated circuit formed of a conductive pattern and a circuit element into a circuit board on its top surface; and sealing top, side and bottom surfaces of the circuit board with a sealing resin containing a thermosetting resin by injecting the sealing resin into a cavity with the circuit board placed in the cavity of a molding die, wherein in the step of sealing, the bottom surface of the circuit board is coated with a molten resin sheet containing a thermosetting resin with the resin sheet interposed between the circuit board and a bottom surface of an inner wall of the molding die.

The present invention provides a resin sheet, which is formed by pressure-molding a resin material in powder form containing a thermosetting resin, for use in a process for resin-sealing a circuit element, wherein at the time of resin sealing of the circuit element using a molding die, the resin sheet is placed, in conjunction with the circuit element, within a cavity of the molding die, and is melted and heat-cured thereby to form part of a sealing resin to seal the circuit element.

The present invention provides a circuit device manufacturing method, including resin-sealing a circuit element, using a molding die, including the steps of: preparing a resin sheet formed by pressure-molding a resin material in powder form containing a thermosetting resin; and sealing the circuit element with a sealing resin containing the molten resin sheet, the resin sheet being placed, in conjunction with the circuit element, in a cavity of the molding die.

A circuit device manufacturing method of the present invention includes the steps of: preparing a semiconductor wafer having plural semiconductor element units formed by a diffusion process, and having an external connection electrode formed on one principal surface, the external connection electrode being connected to each of the semiconductor element units; sealing the one principal surface and the other principal surface of the semiconductor wafer with a resin; and dividing the semiconductor wafer for each of the semiconductor element units, wherein in the step of sealing, a resin sheet containing a thermosetting resin is melted thereby to coat the other principal surface of the semiconductor wafer.

A circuit device of the present invention includes: a semiconductor substrate having a first principal surface and a second principal surface, the first principal surface having an external connection electrode formed thereon; a first sealing resin that coats the first principal surface of the semiconductor substrate and a side surface of the external connection electrode; and a second sealing resin that coats the second principal surface of the semiconductor substrate, wherein the second sealing resin is formed by melting a resin sheet containing a thermosetting resin.

According to the present invention, transfer molding takes place with the thin resin sheet containing the thermosetting resin interposed between the bottom surface of the circuit board and the bottom surface of the inner wall of the molding die. Therefore, the molten, heat-cured resin sheet is filled into the gap between the bottom surface of the circuit board and the bottom surface of the inner wall of the molding die, and thus, the bottom surface of the circuit board can be coated with a thin coating of the heat-cured resin sheet.

Further, the present invention enables the use of an existing molding die as it is because of effecting no change in the shape of the molding die for use in molding, and thus, there is little increase in cost by the adoption of the present invention.

At the time of resin sealing of the circuit element by injection molding using the molding die, the resin sheet of the present invention is placed in a gap in which the filling of the injected sealing resin is unlikely. In so doing, the heated, molten resin sheet is filled into the gap, which in turn enables preventing the occurrence of a void resulting from the sealing resin not spreading throughout the gap.

According to the present invention, the extremely thinly formed resin sheet is melted thereby to coat the principal surface of the semiconductor wafer, and thus, there is provided the circuit device in which the principal surface is coated with a thin, even coating of resin. Further, the principal surface on which a semiconductor material is typically exposed is coated with a thin coating of resin, thus leading to the manufacture of the circuit device that achieves the prevention of occurrence of a crack and also has an improvement in mechanical strength of the device as a whole.

DESCRIPTION OF THE INVENTION

First Embodiment

Figure 1A:
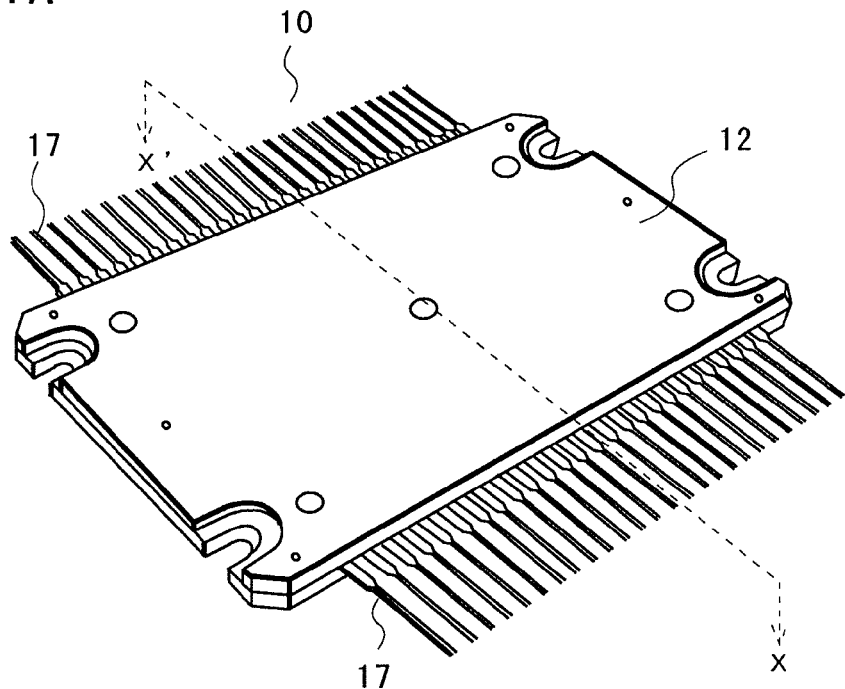
FIG. 1A and FIGS. 1B and 1C are a perspective view and cross-sectional views, respectively, showing a hybrid integrated circuit device as manufactured by a circuit device manufacturing method according to the present invention.

Description will be given with reference to FIGS. 1A to 1C with regard to a configuration of a hybrid integrated circuit device 10 manufactured by a circuit device manufacturing method according to the present invention. FIG. 1A is a perspective view of the hybrid integrated circuit device 10, FIG. 1B is a cross-sectional view taken along the line X-X' of FIG. 1A, and FIG. 1C is a cross-sectional view useful in explaining a configuration of a sealing resin.

Figure 1B:
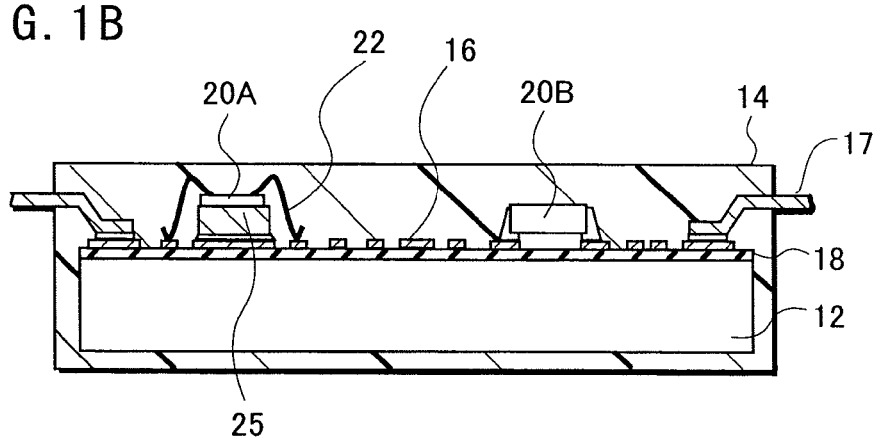
Figure 1C:
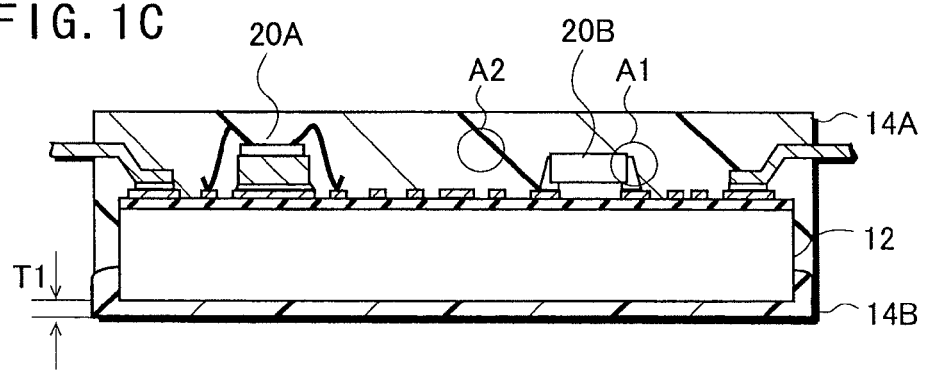

Referring to FIGS. 1A and 1B, in the hybrid integrated circuit device 10, a hybrid integrated circuit formed of a conductive pattern 16 and a circuit element is constructed on the top surface of a circuit board 12, and a lead 17 connected to the circuit is led out to the outside. Further, the hybrid integrated circuit constructed on the top surface of the circuit board 12, and the top, side and bottom surfaces of the circuit board 12 are integrally coated with a sealing resin 14 made of a thermosetting resin.

The circuit board 12 is the board made of metal such as aluminum or copper. With the use of aluminum as a material for the circuit board 12, the top and bottom surfaces of the circuit board 12 are coated with an anode oxide film (or an anodizing film). The specific size of the circuit board 12 is, for example, approximately 61 mm in length, 42.5 mm in width, and 1.5 mm in thickness. Here, materials other than the metal may be used as the material for the circuit board 12, and for example, a ceramic or resin material may be used as the material for the circuit board 12.

Here, the side surface of the circuit board 12 assumes a surface perpendicular to the top surface; however, the side surface may be an inclined surface inclined with respect to the top surface. If the side surface of the circuit board 12 is formed of the inclined surface, there are provided a first inclined surface extending downward continuously from the top surface of the circuit board, and a second inclined surface extending upward continuously from the bottom surface of the circuit board.

An insulating layer 18 is formed so as to coat the entire front surface of the circuit board 12. The insulating layer 18 is made of an epoxy resin highly filled with a filler. The filling of the filler reduces thermal resistance of the insulating layer 18, and thus, heat produced by the internal circuit element is excellently conducted to the circuit board 12 via the insulating layer 18.

The conductive pattern 16 is made of a metal film such as copper having a thickness on the order of 50 μm, and is formed on the front surface of the insulating layer 18 so as to implement a predetermined electric circuit. Also, a pad made of the conductive pattern 16 is formed at or around a location where the lead 17 is led out.

The circuit element formed of a semiconductor element 20A and a chip element 20B is fixed to the conductive pattern 16 in a predetermined location through a bonding material such as solder. A transistor, an LSI chip, a diode, or the like is used as the semiconductor element 20A. Here, the semiconductor element 20A and the conductive pattern 16 are connected together by a fine metal wire 22. A chip resistor, a chip capacitor, or the like is used as the chip element 20B. Electrodes on both ends of the chip element 20B are fixed to the conductive pattern 16 through a bonding material such as solder. Further, a resin sealing type package may be fixed as the circuit element to the conductive pattern 16.

Solder, conductive paste, or the like is used as the bonding material for bonding the circuit element. Here, lead eutectic solder or lead-free solder may be used as the solder. Further, high-temperature solder having a higher melting point than a temperature (for example, 180° C.) at which the sealing resin 14 is formed is used as the solder. Ag (silver) paste, Cu (copper) paste, or the like is used as the conductive paste.

The lead 17 is fixed to the pad provided on the periphery of the circuit board 12, and functions as an external connection terminal to let an input or output signal pass through. Referring to FIG. 1B, many leads 17 are provided along two opposite sides of the circuit board 12. Here, the leads 17 may be led out from four sides of the circuit board 12 or may be led out from one side thereof.

The sealing resin 14 is formed by transfer molding using the thermosetting resin. In FIG. 1B, the sealing resin 14 is used to seal the conductive pattern 16, the semiconductor element 20A, the chip element 20B and the fine metal wire 22. Then, the top, side and bottom surfaces of the circuit board 12 are coated with the sealing resin 14. An epoxy resin, orthocresol novolak biphenyl, dicyclopentadiene, or the like is used as the thermosetting resin that forms the sealing resin 14. Also, the sealing resin 14 contains a filler mixed therein for purposes of a reduction in thermal resistance or the like. For example, the percentage of the filler contained in the sealing resin 14 lies between 70 wt % and 90 wt %, both inclusive. Then, a mixture of crystal silica and crushed silica is used as the type of the filler; however, fused silica, alumina or silicon nitride may be used. Further, an average particle diameter of the filler mixed lies between 20 μm and 30 μm, both inclusive, for example.

Further description will be given with reference to FIG. 1C with regard to the sealing resin 14. The sealing resin 14 is made of a first sealing resin 14A and a second sealing resin 14B. In the drawing, the boundary between the first sealing resin 14A and the second sealing resin 14B is shown; however, in an actual circuit device, the first and second sealing resins 14A and 14B are integrally formed. Although details will be described later, the first sealing resin 14A is formed by injecting a liquid resin into a cavity of a molding die, and the second sealing resin 14B is formed by melting a resin sheet disposed on the bottom surface of the circuit board 12. A thickness T1 of the second sealing resin 14B coating the bottom surface of the circuit board 12 lies between 0.1 mm and 0.3 mm, both inclusive, for example, which is very thin. The thin second sealing resin 14B is small in thermal resistance, and thus, heat radiated from the circuit element such as the semiconductor element is excellently released to the outside via the circuit board 12 and the second sealing resin 14B.

In the first embodiment, the filler contained in the second sealing resin 14B is more uniformly dispersed than the filler contained in the first sealing resin 14A. Specifically, the first sealing resin 14A is formed by injecting the liquid resin into the cavity of the molding die. Therefore, the filler stays and is relatively dense in a region where the flow of the thermosetting resin in liquid form is inhibited. For example, in a region A1 where the chip element 20B or the semiconductor element 20A is disposed, the flow of the sealing resin in liquid form is inhibited by these elements, and thus, the filler is dense. On the other hand, in a region A2 where the circuit element such as the semiconductor element is not disposed, the flow of the sealing resin is good, and thus, the filler is relatively sparsely disposed as compared to the region A1.

On the other hand, the second sealing resin 14B coating the bottom surface of the circuit board 12 is formed by melting and heat-curing the resin sheet disposed on the bottom surface of the circuit board 12, rather than by injection molding. Therefore, the second sealing resin 14B does not basically flow in the resin sealing process, and thus, the filler is filled throughout the entire area of the second sealing resin 14B. Thus, the thermal resistance of the second sealing resin 14B is uniform throughout the entire area, and thus, heat radiation from the bottom surface of the circuit board 12 is good as a whole.

Referring to FIG. 1C, the entire area of the bottom surface of the circuit board 12 and a lower portion of the side surface thereof are coated with the second sealing resin 14B; however, the circuit board 12 may be such that only the bottom surface of the circuit board 12 is coated with the second sealing resin 14B, and the side and top surfaces of the circuit board 12 are coated with the first sealing resin 14A. Further, the circuit board 12 may be such that the vicinity of a central portion of the bottom surface of the circuit board 12 is coated with the second sealing resin 14B, and the surfaces of top, side and peripheral bottom of the circuit board 12 are coated with the first sealing resin 14A.

A method of manufacturing the hybrid integrated circuit device of the above-mentioned configuration will be described with reference to FIGS. 2A to 5.

Figure 2A:
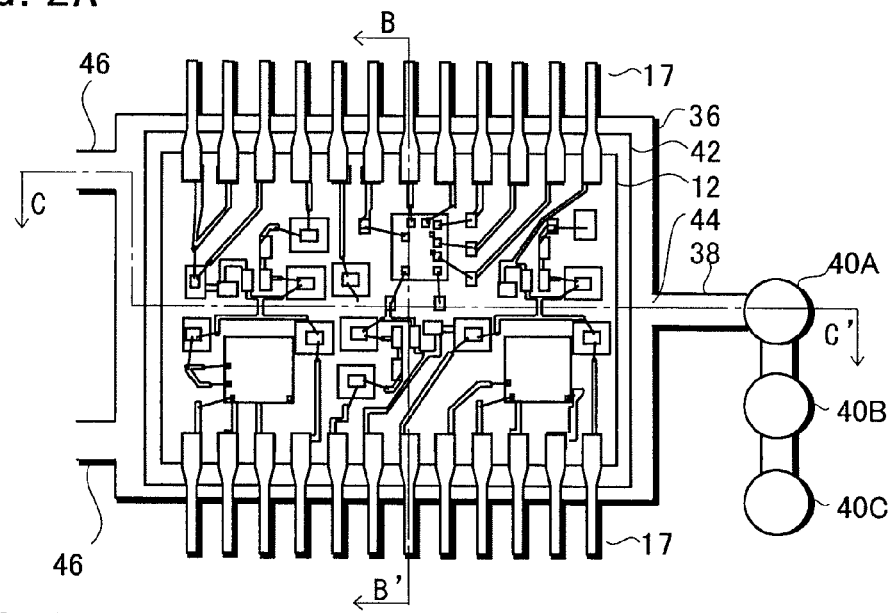
FIG. 2A and FIGS. 2B and 2C are a plan view and cross-sectional views, respectively, showing the circuit device manufacturing method according to the present invention.
Figure 2B:
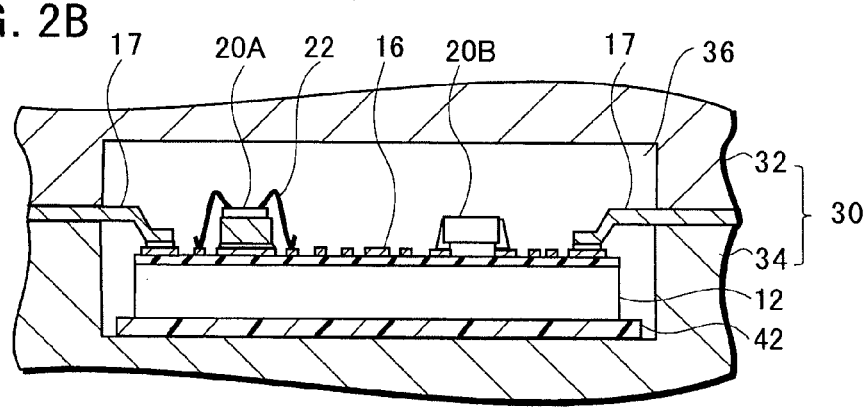
Figure 2C:
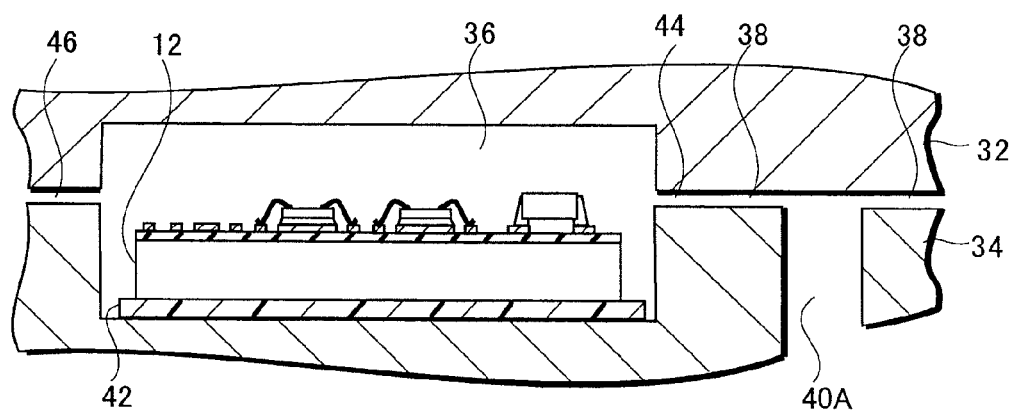

Referring to FIGS. 2A to 2C, first, the circuit board 12 containing on its top surface a hybrid integrated circuit is placed in a cavity 36 of a molding die 30. FIG. 2A is a plan view showing this process, FIG. 2B is a cross-sectional view taken along the line B-B' of FIG. 2A, and FIG. 2C is a cross-sectional view taken along the line C-C' of FIG. 2A.

Referring to FIGS. 2A and 2B, the conductive pattern 16 formed in a predetermined layout by etching is formed on the top surface of the circuit board 12 of a rectangular shape made of metal such as aluminum. Then, the semiconductor element 20A and the chip element 20B are fixed in a predetermined location on the conductive pattern 16 thereby to form the hybrid integrated circuit. Also, as shown in FIG. 2A, plural leads 17 are fixed to the conductive pattern in the form of pad along upper and lower edges of the circuit board 12.

Referring to FIG. 2B, here, a resin sheet 42 is mounted on a lower die 34, and subsequently, the circuit board 12 is mounted on the top surface of the resin sheet 42. Then, an upper die 32 and the lower die 34 are brought into contact with each other thereby to place the circuit board 12 within the cavity 36. Also, the leads 17 led out from both edges of the circuit board 12 are sandwiched and fixed between the upper die 32 and the lower die 34. The leads 17 are sandwiched between the upper and lower dies as mentioned above thereby to fix the top and bottom positions and the right and left positions of the circuit board 12 in the cavity 36. Incidentally, at an initial stage in this process, the resin sheet 42 is a solid state in which a granular thermosetting resin is press molded. Also, the molding die 30 is equipped with a heater (not shown), and is heated to a temperature (for example, 170° C. or higher) at which the resin sheet 42 is melted and heat-cured. Heating of the molding die 30 may be started before the mounting of the resin sheet 42, or may be started after the mounting of the resin sheet 42.

A configuration of the molding die 30 will be described with reference to FIG. 2A. The molding die 30 is configured by including plural pods that communicate with the cavity 36 via a runner 38. Here, three pods 40A, 40B and 40C communicate in series with one cavity 36 via the runner 38. The pods 40A, 40B and 40C are spaces for accommodation of pellet made of a cylindrical thermosetting resin. The runner 38 acts as a path to transport the sealing resin in liquid form into which the pellet is melted, from the pod to a gate 44 of the cavity 36. A side wall of the cavity 36 opposite to the gate 44 that acts as an injection port for the sealing resin is provided with two air vents 46. The air vents 46 acts as a path for escape of air in the cavity 36 at the time of injection of the sealing resin through the gate 44 into the cavity 36.

Referring to FIG. 2C, the lower die 34 is partially hollowed and thereby provided with the pod 40A therein, and this configuration is the same as the pods 40B and 40C. Here, the pod 40A and the like may be provided in the upper die 32.

Figure 3A:
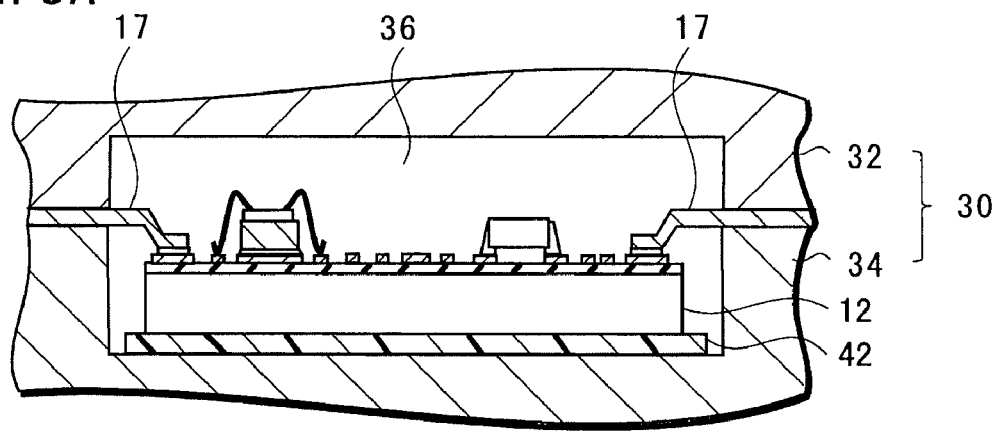
FIG. 3A and FIGS. 3B and 3C are a cross-sectional view and enlarged cross-sectional views, respectively, showing the circuit device manufacturing method according to the present invention.
Figure 3B:
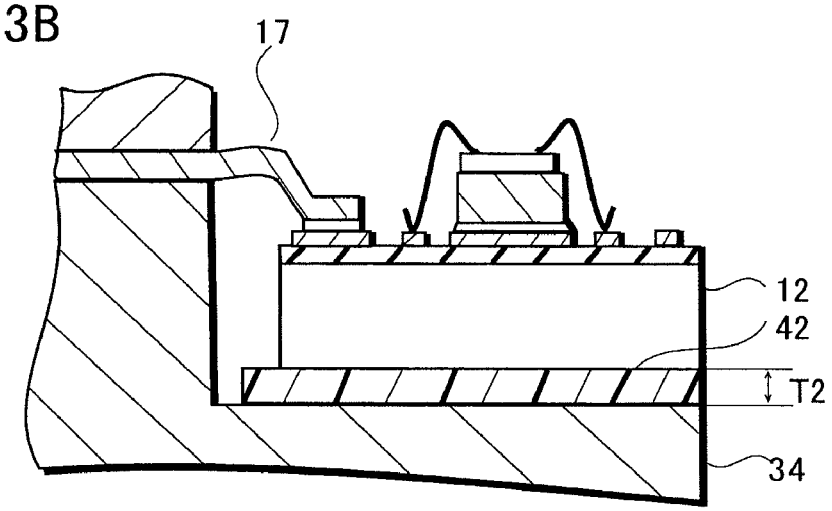
Figure 3C:
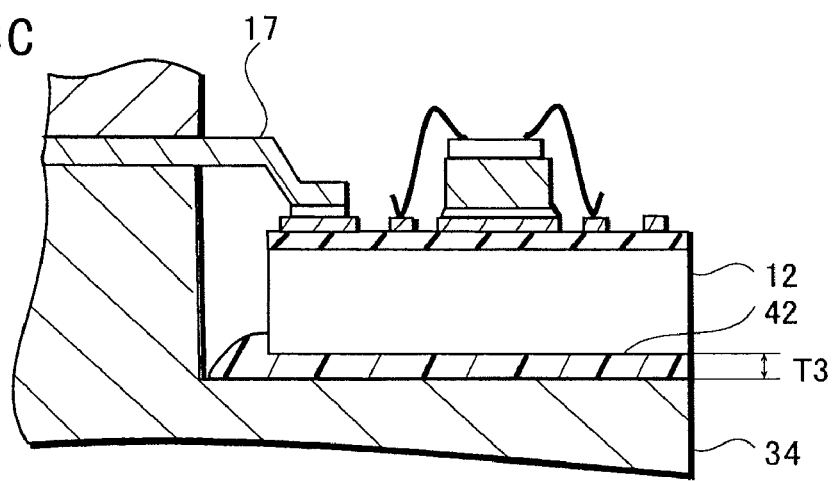

Referring to FIGS. 3A to 3C, then, the resin sheet 42 is melted thereby to coat the bottom surface of the circuit board 12 with a thin coating of sealing resin. FIG. 3A is a cross-sectional view showing this process, FIG. 3B is an enlarged cross-sectional view showing the resin sheet 42 before melting, and FIG. 3C is an enlarged cross-sectional view showing the resin sheet 42 after melting.

Description will now be given with regard to the resin sheet 42 coating the bottom surface of the circuit board 12. The resin sheet 42 is melted and heat-cured thereby to form part of the sealing resin coating the circuit board 12. Specifically, the resin sheet 42 is obtained by pressure-molding a thermosetting resin in powder form having a filler, a curing agent or the like added thereto, into a sheet form of a predetermined shape. A composition of the resin sheet 42 may be the same as the sealing resin injected into the cavity 36 of the molding die, or may be different therefrom. A specific composition of the resin sheet 42 is the same as the above-mentioned sealing resin, and is obtained by molding a thermosetting resin having a filler, a curing agent or the like added thereto, into granular form. As employed here, the thermosetting resin is in the form of granule of 1 mm or less in diameter.

Also, the resin sheet 42 is pressure molded at ordinary temperatures at extremely high pressure, and thus, the percentage of filling (i.e., the volume percentage of a structural element such as resin powder relative to the overall resin sheet 42) is 99% or more, which is higher than a tablet to be described later. Therefore, an extremely small amount of air is contained in the resin sheet 42, which in turn suppresses the occurrence of a void in the sealing resin coating the resin sheet 42.

Referring to FIG. 3B, a thickness T2 of the resin sheet 42 is greater than the thickness (T1 shown in FIG. 1C) of the sealing resin coating the bottom surface of the circuit board 12 in the hybrid integrated circuit device 10 manufactured. Specifically, if the thickness T1 of the sealing resin shown in FIG. 1C lies between 0.1 mm and 0.3 mm, both inclusive, the thickness T2 of the resin sheet 42 is set to lie between 0.5 and 0.6 mm, both inclusive. On the other hand, as mentioned above, the position of the circuit board 12 in the cavity 36 is fixed by sandwiching the leads 17 by the molding die 30. Therefore, the shape and position of the lead 17 are set so that a distance between the bottom surface of the circuit board 12 and the top surface of the inner wall of the lower die 34 is equal to T1 (see FIG. 1C). Thus, when the resin sheet 42 and the circuit board 12 are superimposed and mounted on the lower die 34, and when the leads 17 are sandwiched by the molding die 30, the leads 17 are elastically deformed by pressing and bending stress in a direction from top to bottom, and as a result, the resin sheet 42 is pressed against the lower die 34 and fixed by the bottom surface of the circuit board 12. In this drawing, there is shown the lead 17 elastically deformed by being sandwiched by the molding die 30.

The molding die 30 is heated as mentioned above, and thus, with the passage of time, the resin sheet 42 is melted and softened, and the bottom surface of the circuit board 12 is coated with the resin sheet 42 in liquid or semisolid form.

Also, referring to FIG. 3C, the elastically deformed lead 17 is sandwiched by of the molding die as mentioned above, and thus, when the resin sheet 42 is softened and loses supporting force, the shape of the lead 17 is restored to its original state, and the circuit board 12 sinks downward. Then, as the circuit board 12 sinks, a portion of the softened resin sheet 42 moves from underneath the circuit board 12 to the side thereof, and coats the vicinity of a bottom end of the side surface of the circuit board 12. In this manner, a thickness T3 of the resin sheet 42 coating the bottom surface of the sunk circuit board 12 lies between 0.1 mm and 0.3 mm, both inclusive, for example, which is equivalent to the thickness T1 of the sealing resin shown in FIG. 1C.

Also, referring to FIG. 3A, the planar size of the resin sheet 42 is larger than that of the circuit board 12, and the periphery of the resin sheet 42 extends sideward beyond the circuit board 12. The planar size of the resin sheet 42 is larger than that of the circuit board 12 as mentioned above, and thereby, the bottom surface of the circuit board 12 is wholly coated with the molten resin sheet 42, and also, the circuit board 12, also inclusive of its side surface, is coated therewith.

Here, the planar size of the resin sheet 42 may be equivalent to that of the circuit board 12, or may be slightly smaller than that of the circuit board 12. If the resin sheet 42 is smaller in size than the circuit board 12, the vicinity of the central portion of the circuit board 12 is coated with the resin sheet 42. The bottom surface of the circuit board 12 is kept spaced apart from the lower die 34, and is coated with resin to be injected in a later process.

Figure 4A:
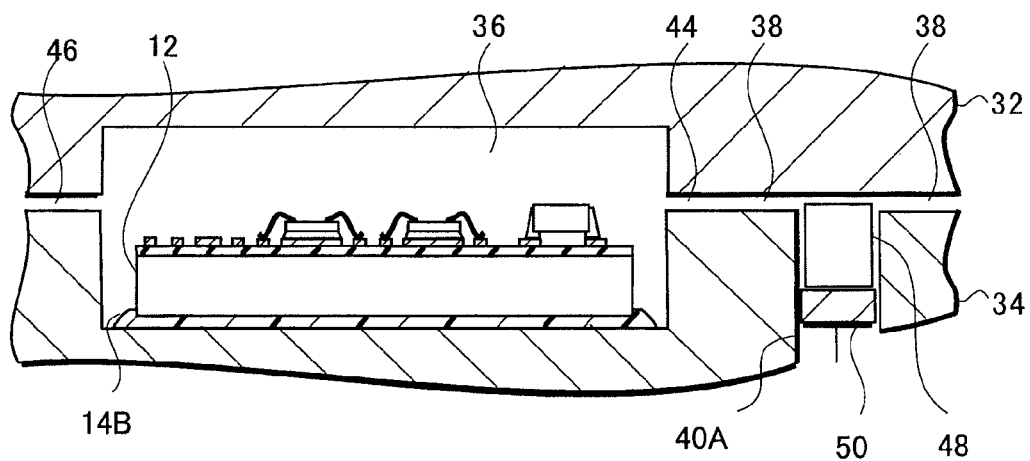
FIGS. 4A and 4B are cross-sectional views showing the circuit device manufacturing method according to the present invention.

Referring to FIG. 4A, then, the sealing resin is injected into the cavity 36. Specifically, a tablet 48 is loaded into the pod 40A provided in the lower die 34 and is heated and melted therein, and subsequently, the tablet 48 is pressed by a plunger 50. The tablet 48 has the same composition as the above-mentioned resin sheet 42, and is obtained by pressure-molding a thermosetting resin in powder form having an additive such as a filler mixed therein, into a cylindrical form. As mentioned above, the molding die is heated to about 170° C. or higher, and thus, when the tablet 48 is loaded into the pod 40A, the tablet 48 is gradually melted. The molten sealing resin in liquid or semisolid form flows through the runner 38 and passes through the gate 44, and is then fed to the cavity 36. Hereinafter, the sealing resin fed through the gate 44 is called the first sealing resin 14A, and the sealing resin made of the molten resin sheet 42 is called the second sealing resin 14B.

Also, as shown in FIG. 2A, the molding die is provided with the plural pods 40A, 40B and 40C, and the tablets 48 are simultaneously loaded into all these pods and are pressed by the plunger 50. Then, the first sealing resin 14A is fed from the pods 40A, 40B and 40C via the runner 38 to the cavity 36. As the first sealing resin 14A is injected through the gate 44, the air in the cavity 36 is released through the vents to the outside. Also, the conductive pattern and the circuit element disposed on the top surface of the circuit board 12 are coated with the first sealing resin 14A.

Figure 4B:
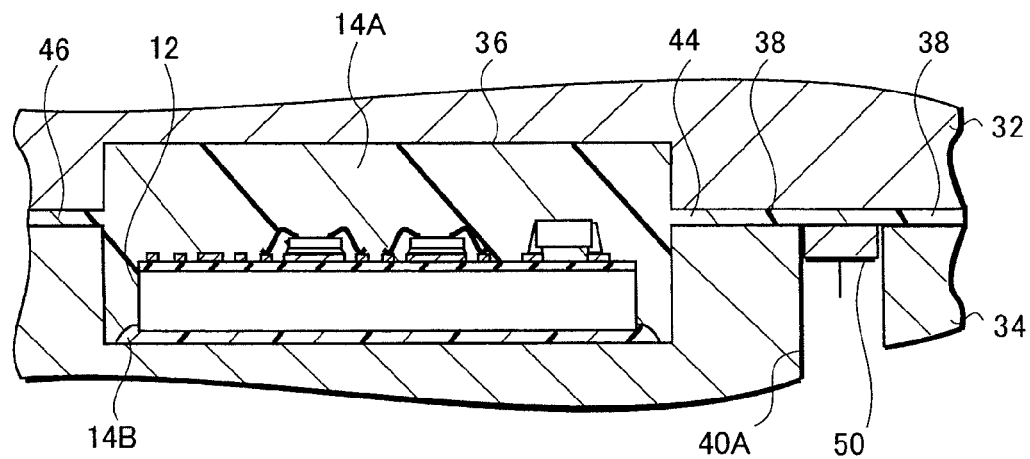

Referring to FIG. 4B, the injected first sealing resin 14A in liquid form is filled into the cavity 36. Here, the temperature of the molding die is higher than a temperature at which the first sealing resin 14A is heat-cured, and thus, the first sealing resin 14A filled into the cavity 36 is polymerized and cured with the passage of time. As shown in FIG. 4B, if the bottom surface of the circuit board 12 and a lower portion of the side surface thereof are coated with the second sealing resin 14B made of the resin sheet 42, the top surface of the circuit board 12 and an upper portion of the side surface thereof are coated with the first sealing resin 14A. On the other hand, if only the bottom surface of the circuit board 12 is coated with the second sealing resin 14B, the top and side surfaces of the circuit board 12 are wholly coated with the first sealing resin 14A. Also, if only the vicinity of the central portion of the bottom surface of the circuit board 12 is partially coated with the second sealing resin 14B, the surfaces top, side and peripheral bottom of the circuit board 12 is coated with the first sealing resin 14A.

When both the first sealing resin 14A and the second sealing resin 14B are sufficiently polymerized and heat-cured by being heated in the molding die, the upper die 32 and the lower die 34 are separated from each other, and the hybrid integrated circuit device as a molded product is removed. After that, the partial sealing resin 14 filled into the air vents 46 and the runner 38 is separated from a main body of the sealing resin 14.

Referring to FIG. 4B, there is shown the boundary between the first sealing resin 14A and the second sealing resin 14B. However, the second sealing resin 14B filled into the bottom surface of the circuit board 12 and the first sealing resin 14A injected through the gate 44 are integrally formed because of being mixed together in liquid or semisolid form. Here, the time required for the first sealing resin 14A and the second sealing resin 14B to cure after melting lies between about 10 and 20 seconds.

In this process, the second sealing resin 14B into which the resin sheet 42 is melted is heat-cured prior to the first sealing resin 14A injected through the gate 44. In so doing, pressure is applied to a boundary portion between the first sealing resin 14A and the second sealing resin 14B by cure shrinkage of the first sealing resin 14A coating most of the circuit board 12, thereby to permit ensuring moisture resistance in the boundary portion. On the other hand, if the second sealing resin 14B undergoes cure shrinkage after the first sealing resin 14A, a crack occurs in the above-mentioned boundary portion by the cure shrinkage acting on the second sealing resin 14B, which can possibly lead to deterioration in the moisture resistance.

Methods for curing the second sealing resin 14B prior to the first sealing resin 14A include a method that involves adjusting heating time of these resins, and a method that involves adjusting the compositions of the resins. In the above-mentioned embodiment, the resin sheet 42 to form the second sealing resin 14B is heated in the cavity 36 prior to the first sealing resin 14A, and thereafter, the tablet 48 to form the first sealing resin 14A is loaded into the pod 40A. Also, for the adjustment of the compositions of the resins, the thermosetting resin requiring a shorter time for heat curing than the thermosetting resin contained in the tablet 48 is used as the thermosetting resin contained in the resin sheet 42. In this instance, the timing of start of heating of the resin sheet 42 may be the same as that of the tablet 48.

Figure 5:
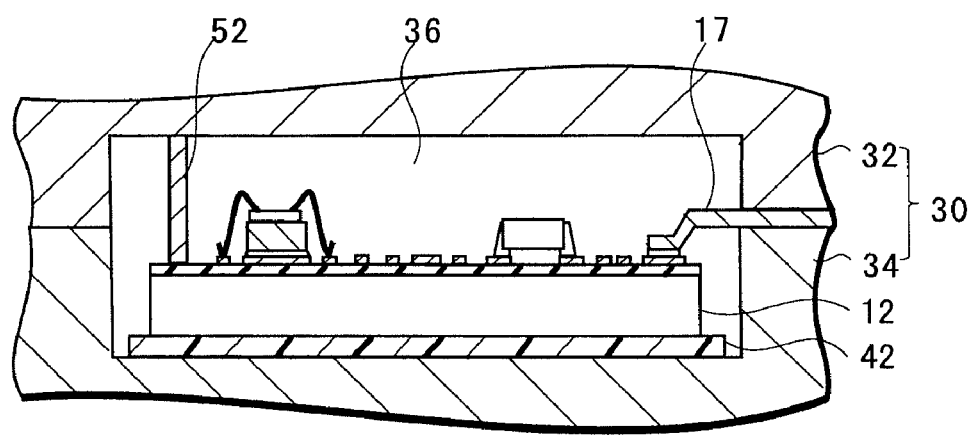
FIG. 5 is a cross-sectional view showing the circuit device manufacturing method according to the present invention.

Another method for resin-sealing the circuit board 12 will be described with reference to FIG. 5. Description will now be given with regard to a method for resin-sealing a circuit device in which the leads 17 are fixed only along the right side edge of the circuit board 12. Referring to FIG. 5, the leads 17 are fixed along the right side surface as seen in the drawing, and thus, it is difficult to sandwich the leads 17 by the molding die 30 and thereby fix the position of the circuit board 12 as described above with reference to FIG. 2B. Here, a contact pin 52 is provided on the inner wall of the upper die 32, and the contact pin 52 is used to press downward the circuit board 12 in the vicinity of the left end of the top surface thereof and thereby fix the position of the circuit board 12. The contact pin 52 may be fixed on the inner wall of the upper die 32, or may be vertically movable. Further, the resin sheet 42 mounted under the circuit board 12 is also fixed by pressing forces of the leads 17 and the contact pin 52. Incidentally, besides a method for fixing the circuit board 12, the manufacturing method is the same as described with reference to FIGS. 2A to 4B.

The resin sheet 42 may be just one sheet, or a plurality of resin sheets 42 may be used instead. When two or more resin sheets 42 of a smaller size are used for one molding, the smaller resin sheets 42 are less prone to failure during the manufacturing process than one large resin sheet 42.

Second Embodiment

Figure 6A:
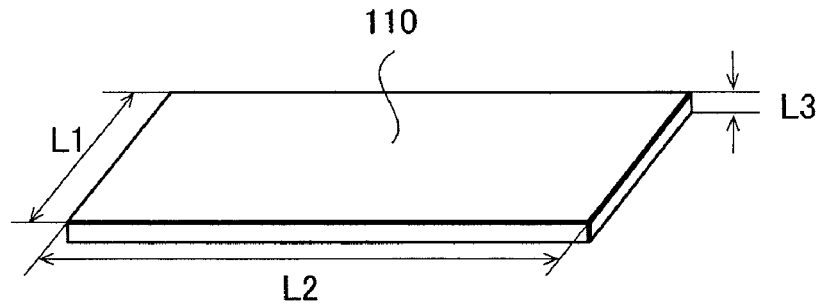
FIGS. 6A, 6B and 6C are a perspective view of a resin sheet, a cross-sectional view thereof, and a cross-sectional view of the resin sheet as being pressure-molded, respectively, showing the resin sheet according to the present invention.
Figure 6B:
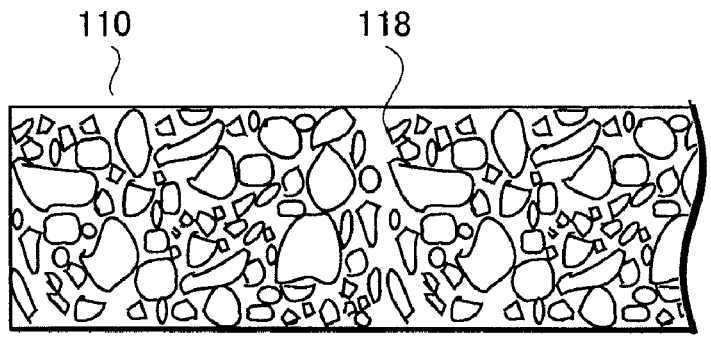
Figure 6C:
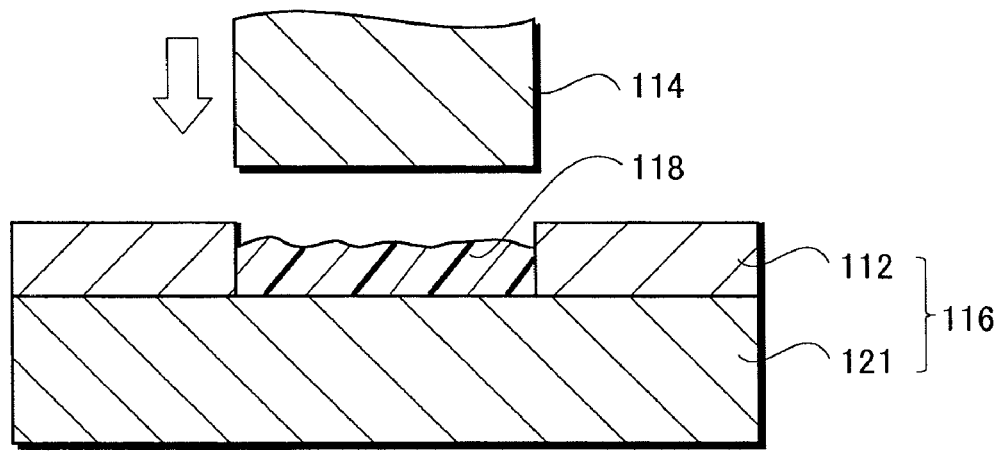

In the second embodiment, description will be given with reference to FIGS. 6A to 6C with regard to a configuration of a resin sheet 110 and a method of manufacturing the resin sheet 110. FIG. 6A is a perspective view showing the resin sheet 110, FIG. 6B is a cross-sectional view of the resin sheet 110, and FIG. 6C is a cross-sectional view showing the method of manufacturing the resin sheet 110.

Referring to FIG. 6A, the resin sheet 110 according to the second embodiment is molded by pressing a powdered resin in granular form having a thermosetting resin as the main ingredient, and assumes the form of sheet. The resin sheet 110 is used to resin-seal a circuit element such as a semiconductor element by use of a molding die, and forms a portion of a sealing resin for sealing the circuit element.

The resin sheet 110 according to the second embodiment may be applied to resin sealing of various types of circuit devices, and may be applied for example to a hybrid integrated circuit device in which a circuit board having many circuit elements arranged on a top surface is resin-sealed, or a semiconductor device of a lead frame type in which an island having a semiconductor element mounted thereon is resin-sealed.

Figure 8A:
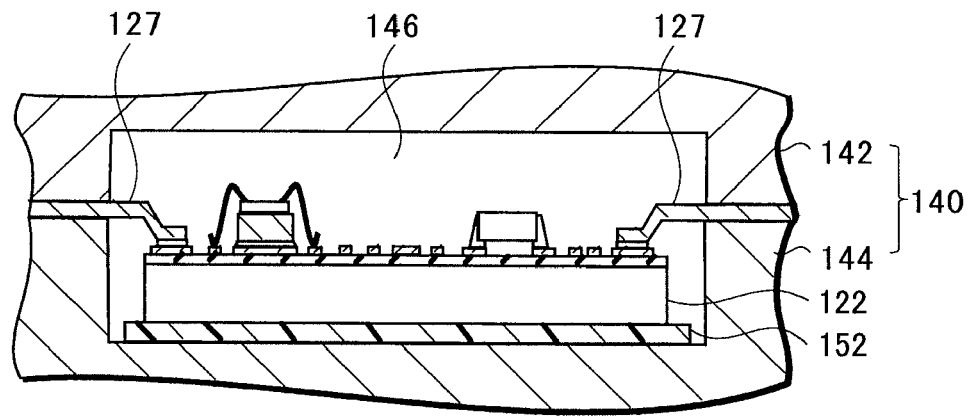
FIG. 8A and FIGS. 8B and 8C are a cross-sectional view and enlarged cross-sectional views, respectively, showing the circuit device manufacturing method according to the present invention.

When the resin sealing is applied to the hybrid integrated circuit device, referring to FIG. 8A, the resin sheet 110 (or a resin sheet 152 in FIG. 8A) is disposed between the bottom surface of a circuit board 122 having many circuit elements embedded therein on its top surface and a lower die 144. Then, referring to FIG. 9B, the bottom surface of the circuit board 122 is coated with a thin coating of a second sealing resin 124B made of the molten resin sheet 152. The second sealing resin 124B, in conjunction with a first sealing resin 124A injected through a gate 154, forms part of the sealing resin that integrally coats the circuit elements and the circuit board 122.

Figure 12A:
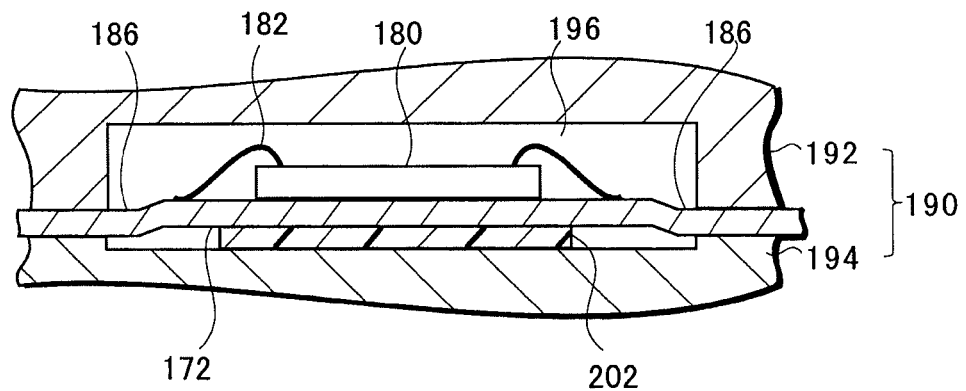
FIG. 12A and FIGS. 12B and 12C are a cross-sectional view and enlarged cross-sectional views, respectively, showing the circuit device manufacturing method according to the present invention.

When the resin sealing is applied to the semiconductor device of the lead frame type, referring to FIG. 12A, the resin sheet 110 (or a resin sheet 202 in FIG. 12A) is disposed between the bottom surface of an island 172 having a semiconductor element 180 fixed on a top surface and the bottom surface of an inner wall of a lower die 194. Then, referring to FIG. 13B, the bottom surface of the island 172 is coated with a second sealing resin 174B made of the molten resin sheet 202, and the second sealing resin 174B forms part of the sealing resin coating the overall device.

As mentioned above, in the second embodiment, the resin sheet 110 is interposed between the bottom surface of the circuit board or the island and the inner wall of the lower die, and is then melted so that the bottom surface of the circuit board or the island is coated with a thin coating of the heat-cured resin sheet 110. Therefore, even if a gap between the bottom surface of the circuit board or the island and the inner wall of the lower die is extremely narrow, for example on the order of 0.3 mm, the gap can be filled with the molten resin sheet 110. Consequently, this enables a reduction in the thickness of the sealing resin coating the bottom surface of the circuit board or the island, and thus, heat produced by the circuit elements embedded in the circuit device can be favorably released to the outside through the thin sealing resin.

Figure 10A:
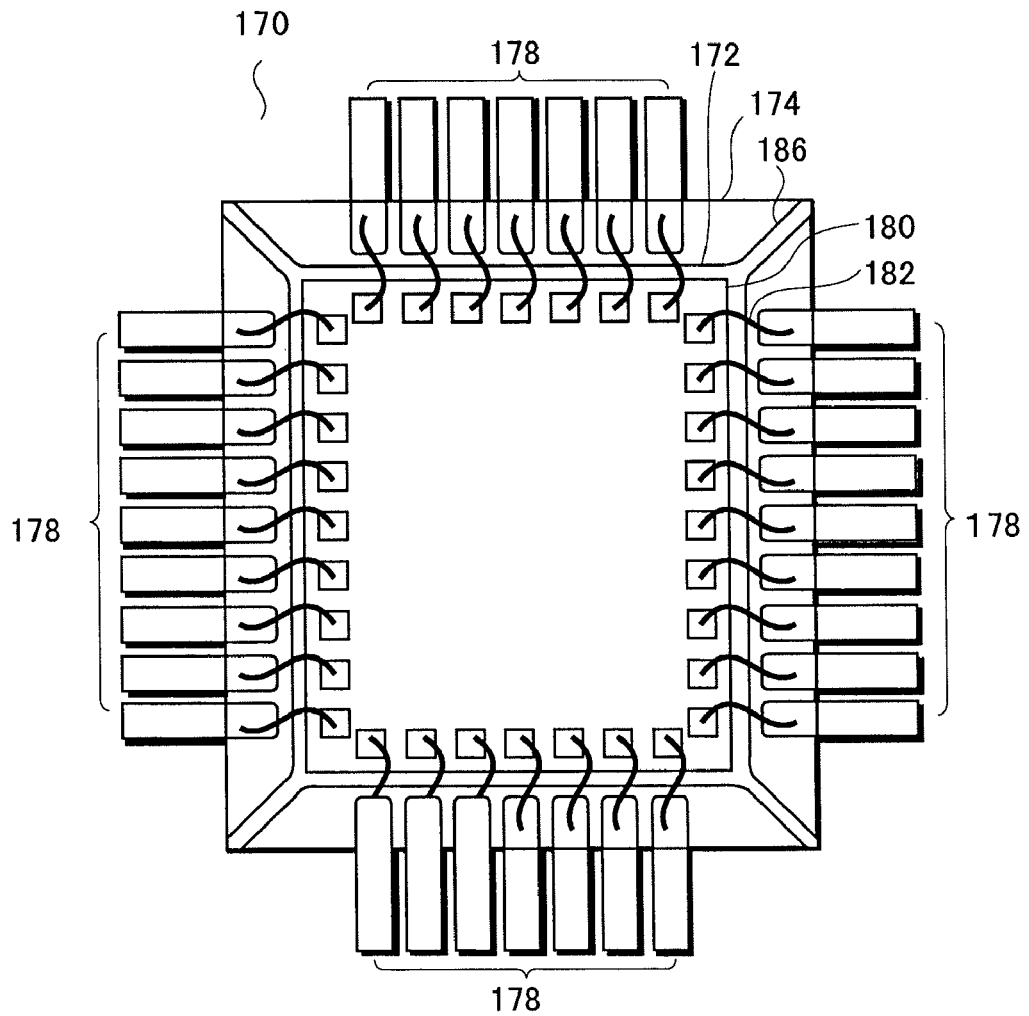
FIGS. 10A and 10B are a plan view and a cross-sectional view, respectively, showing a circuit device manufacturing method according to the present invention.
Figure 10B:
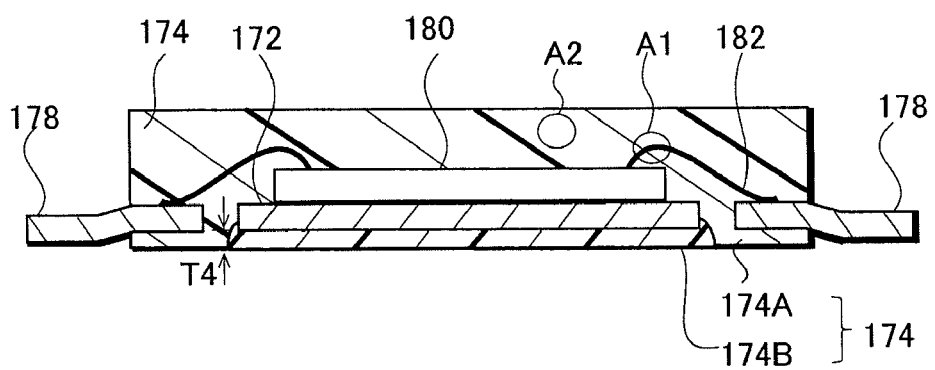

The planar size (L1×L2) of the resin sheet 110 varies according to the type of circuit device in which the resin sheet 110 is used. With application to resin sealing of a hybrid integrated circuit device 120 as shown for example in FIGS. 7A to 7C, the size of the resin sheet 110 is equivalent to that of the circuit board 122 (see FIG. 7C), and is of the order of L1×L2=60 mm×40 mm. Also, with application to resin sealing of a circuit device 170 as shown in FIGS. 10A and 10B, the planar size of the resin sheet 110 is equivalent to that of the island 172, and is of the order of L1×L2=10 mm×10 mm, for example.

Figure 9A:
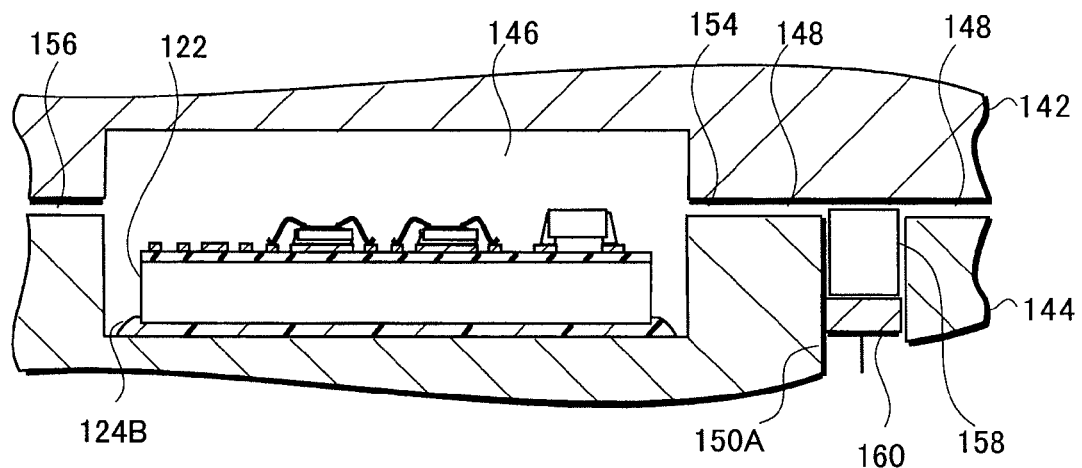
FIGS. 9A and 9B are cross-sectional views showing the circuit device manufacturing method according to the present invention.

A thickness L3 of the resin sheet 110 lies between 0.1 mm and 0.6 mm, both inclusive, for example. The resin sheet 110 having a thickness of 0.6 mm or less enables resin-sealing the back surface of the circuit board 122 with the thin coating of the second sealing resin 124B made of the molten resin sheet 152, as shown in FIG. 9A. On the other hand, the resin sheet 110 having a thickness of 0.1 mm or more ensures that stiffness of the resin sheet 110 is kept at a given level or higher, and thus suppresses cracking or the like in the resin sheet 110 in a transport stage. More preferably, the thickness of the resin sheet 110 lies between 0.1 mm and 0.4 mm, both inclusive, and in so doing, the greater above-mentioned merit is obtained.

Further, the thickness L3 of the resin sheet 110 is set greater than that of the sealing resin made of the molten resin sheet 110, coating the circuit board or the island. Specifically, referring to FIG. 8B, the thickness T2 of the resin sheet 110 (or the resin sheet 152) disposed between the bottom surface of the circuit board 122 and the lower die 144 lies between 0.4 mm and 0.6 mm, both inclusive, for example. On the other hand, referring to FIG. 8C, the thickness T3 of the softened, molten resin sheet 152 lies between 0.1 mm and 0.3 mm, both inclusive, which is less than the thickness of the resin sheet 152 yet to be melted. In so doing, the resin sheet 152 is melted with the resin sheet 152 pressed against the bottom surface of the circuit board 122, and thus, the bottom surface of the circuit board 122 is coated with the molten resin sheet 110 without a void occurring.

FIG. 6B is a cross-sectional view showing an enlarged portion of the resin sheet 110. Referring to FIG. 6B, the resin sheet 110 is constructed of a powdered resin 118 in the form of many granules. The powdered resin 118 is made of a thermosetting resin such as an epoxy resin having an additive such as a filler added thereto, and the diameter of the powdered resin 118 is equal to or less than 1.0 mm, for example. In other words, the powdered resin capable of passing through a screen having an opening with a size of 1.0 mm×1.0 mm is used as the powdered resin 118.

Further, in the resin sheet 110, the percentage of filling of the powdered resin 118 (i.e., the proportion of the powdered resin 118 relative to the total volume of the resin sheet 110) is equal to or more than 99%. The percentage of filling of the powdered resin 118 in the resin sheet 110 according to the second embodiment is very high, taking it into account that the percentage of filling of pellet for use in general resin sealing is of the order of 95%. The percentage of filling of the resin sheet 110 is set high as mentioned above thereby to suppress the formation of a void in the sealing resin into which the resin sheet 110 is melted.

The method of manufacturing the above-mentioned resin sheet 110 will be described with reference to the cross-sectional view of FIG. 6C. First, the powdered resin 118 in powder form is prepared. Specifically, materials such as a thermosetting resin in powder form, a filler, and a parting agent are dispensed in predetermined amounts, and subsequently, these materials are mixed together by a mixer. Further, the mixed material is heated and thereby integrally formed and is then crushed thereby to form a resin material in powder form. Moreover, the resin material capable of passing through the screen having the opening with a size of 1.0 mm×1.0 mm is used as the powdered resin 118. Here, an epoxy resin, orthocresol novolak biphenyl, dicyclopentadiene, or the like is used as the thermosetting resin that forms the powdered resin 118. Furthermore, the percentage of the filler mixed in the powdered resin 118 lies between 70 wt % and 90 wt %, both inclusive. Then, a mixture of crystal silica and crushed silica is used as the type of the filler; however, fused silica, alumina or silicon nitride may be used. Further, an average particle diameter of the filler mixed lies between 20 μm and 30 μm, both inclusive, for example. The pressure used to make the resin sheets 110 is typically between 30-60 Kg/m², preferably between 38-45 Kg/m².

The powdered resin 118 of the above-mentioned configuration is molded in the form of sheet by being pressure-molded (or a tableting process) by use of the molding die. Specifically, the molding die formed of an upper die 114 and a lower die 116 made of metal such as stainless steel is used for the tableting process. The lower die 116 is formed of a pedestal 121 whose top surface is a flat surface, and a frame 112 in the form of frame mounted on the top surface of the pedestal 121. Also, the upper die 114 is vertically movable, and assumes such a shape as to fit in an opening of the frame 112. The planar size of the opening of the frame 112 is equivalent to that of the resin sheet 110 molded.

The powdered resin 118 of the above-mentioned composition is placed and flattened in a predetermined amount in the opening of the frame 112. Then, the upper die 114 is moved downward to apply a predetermined pressure to the powdered resin 118 and thereby integrally form the powdered resin 118 and mold the resin sheet 110 shown in FIG. 6A. Here, the pressure applied to the resin powder by the upper die 114 is of the order of a few tens of tons. Also, this process is performed under an ordinary-temperature atmosphere, without heating the molding die.

Figure 20A:
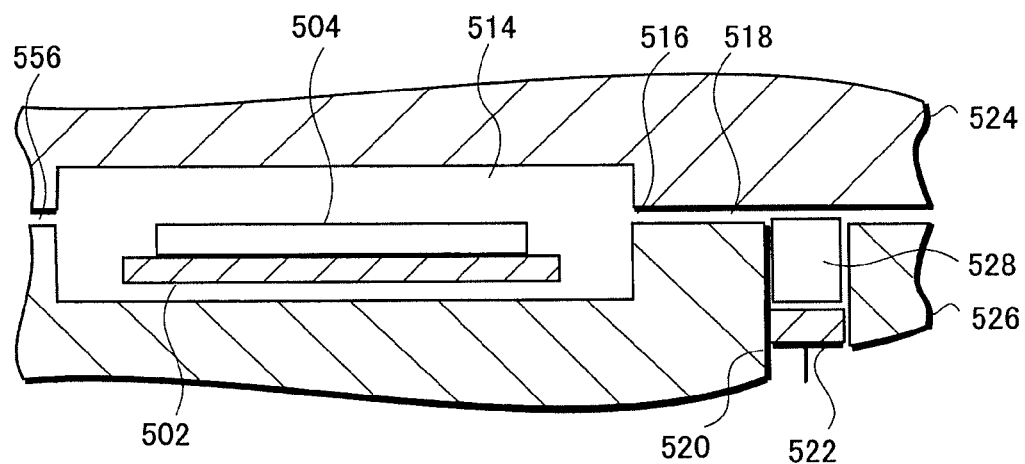
FIGS. 20A and 20B are a view showing a circuit device manufacturing method of the related art, and a cross-sectional view showing the circuit device as manufactured, respectively.
Figure 20B:
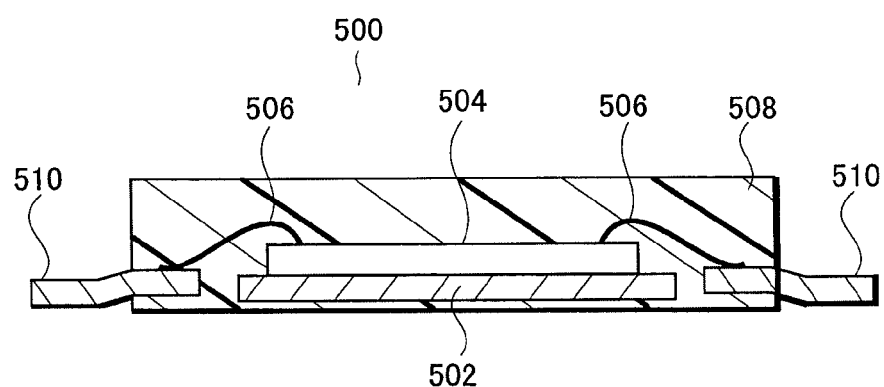
Figure 21:
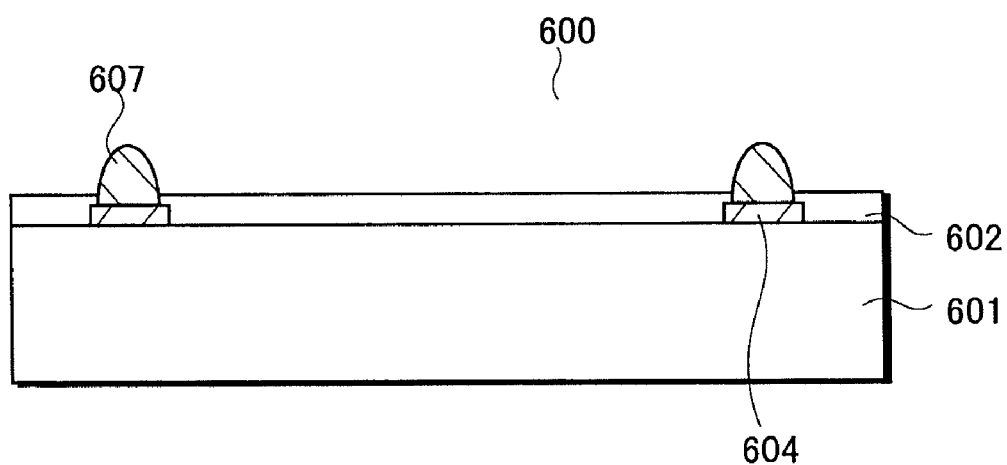
FIG. 21 is a cross-sectional view showing a conventional circuit device.

As mentioned above, the resin sheet 110 according to the second embodiment is obtained by pressure-molding the resin material in powder form, as is the case with the pellet (see FIG. 20A) for use in the related art; however, how the resin sheet 110 is used for resin sealing varies greatly from the related art. Specifically, referring to FIG. 20A, if the pellet 528 is used for resin sealing, first, the pellet 528 is melted in the pod 520 situated outside the cavity 514. Then, the sealing resin in liquid form made of the molten pellet 528 is injected into the cavity 514 via the runner 518 and the gate 516 thereby to resin-seal the semiconductor element 504 and the island 502. In this instance, if the gap between the island 502 and the bottom surface of the inner wall of the lower die 526 is narrow, the sealing resin injected into the gap may not spread well throughout the gap.

On the other hand, referring to FIG. 8A, the resin sheet 110 according to the second embodiment is placed, in conjunction with the circuit element such as the semiconductor element, within a cavity 146 of a molding die 140. Specifically, the resin sheet 110 (or 152) is interposed between the bottom surface of the circuit board 122 having the circuit element embedded therein on its top surface and the bottom surface of the inner wall of the lower die 144. Then, the bottom surface of the circuit board 122 is coated with a thin coating of the molten resin sheet 152. In so doing, even if the gap under the circuit board 122 is extremely narrow, on the order of 0.3 mm, the gap is filled with the molten resin sheet 152, which in turns suppresses the occurrence of a void under the circuit board 122. The resin sheet 110 is formed extremely thinner than the pellet in general use, in order that the resin sheet 110 is placed in the narrow gap as mentioned above.

Third Embodiment

In the third embodiment, description will be given with regard to the resin sheet of the above-mentioned configuration as applied to a sealing resin for coating a circuit board having plural circuit elements mounted on its top surface.

Figure 7A:
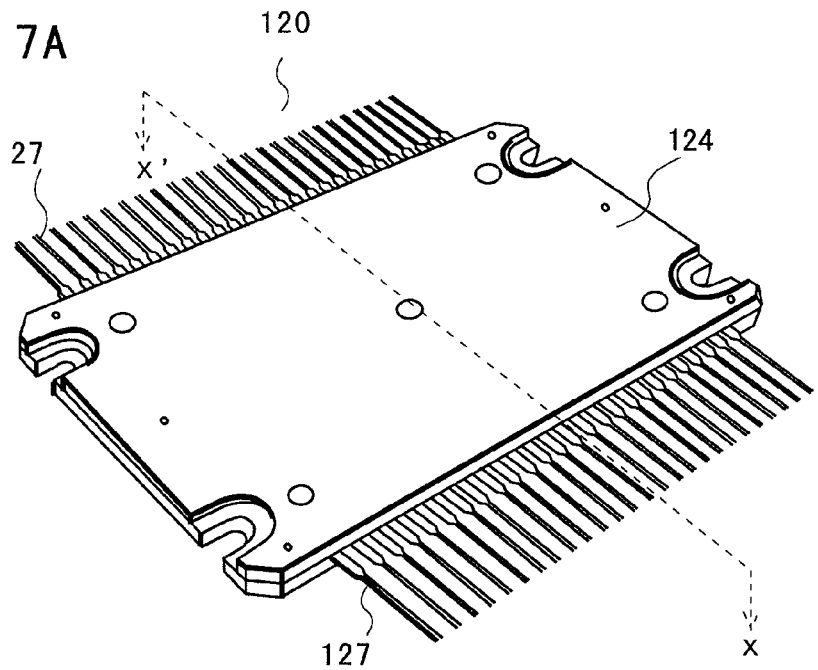
FIG. 7A and FIGS. 7B and 7C are a perspective view and cross-sectional views, respectively, showing a hybrid integrated circuit device as manufactured by a circuit device manufacturing method according to the present invention.

Description will be given with reference to FIGS. 7A to 7C with regard to a configuration of the hybrid integrated circuit device 120 which the above-mentioned resin sheet is applied to. FIG. 7A is a perspective view of the hybrid integrated circuit device 120, FIG. 7B is a cross-sectional view taken along the line X-X' of FIG. 7A, and FIG. 7C is a cross-sectional view useful in explaining a configuration of a sealing resin.

Figure 7B:
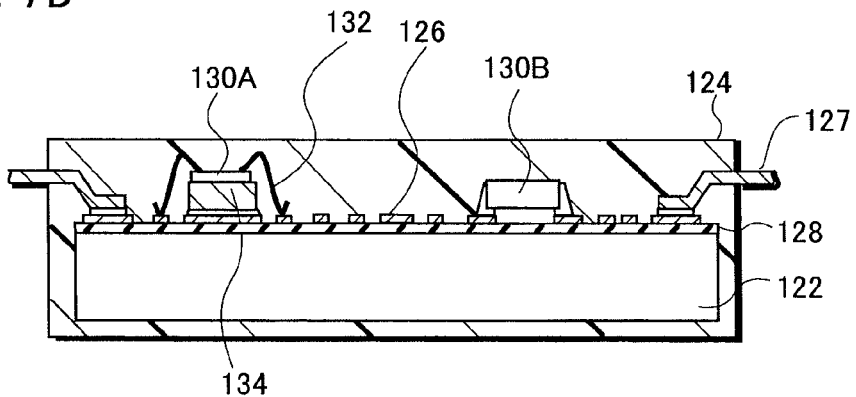
Figure 7C:
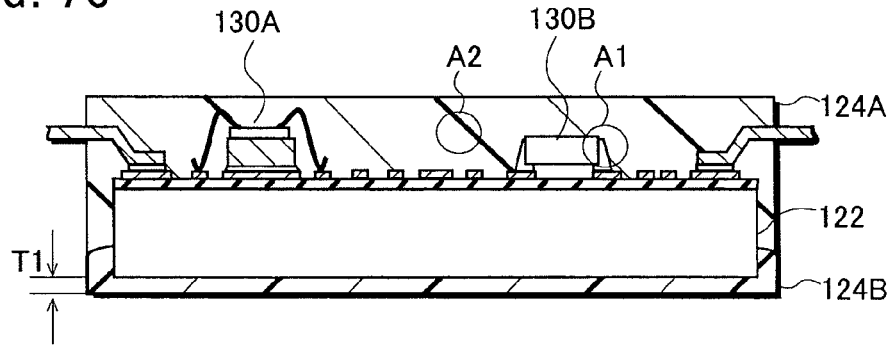

Referring to FIGS. 7A and 7B, in the hybrid integrated circuit device 120, a hybrid integrated circuit formed of a conductive pattern 126 and a circuit element is constructed on the top surface of the circuit board 122, and a lead 127 connected to the circuit is led out to the outside. Further, the hybrid integrated circuit constructed on the top surface of the circuit board 122, and the top, side and bottom surfaces of the circuit board 122 are integrally coated with a sealing resin 124 made of a thermosetting resin.

The circuit board 122 is the board made of metal such as aluminum or copper. The specific size of the circuit board 122 is, for example, approximately 61 mm in length, 42.5 mm in width, and 1.5 mm in thickness. Here, materials other than the metal may be used as the material for the circuit board 122, and for example, a ceramic or resin material may be used as the material for the circuit board 122.

An insulating layer 128 is formed so as to coat the front surface of the circuit board 122 throughout the entire area thereof. The insulating layer 128 is made of an epoxy resin highly filled with a filler. The conductive pattern 126 is made of a metal film such as copper having a thickness on the order of 50 μm, and is formed on the front surface of the insulating layer 128 so as to implement a predetermined electric circuit. Also, a pad made of the conductive pattern 126 is formed at or around a location where the lead 127 is led out.

The circuit element formed of a semiconductor element 130A and a chip element 130B is fixed to the conductive pattern 126 in a predetermined location through a bonding material such as solder. A transistor, an LSI chip, a diode, or the like is used as the semiconductor element 130A. Here, the semiconductor element 130A and the conductive pattern 126 are connected together by a fine metal wire 132. A chip resistor, a chip capacitor, or the like is used as the chip element 130B. Electrodes on both ends of the chip element 130B are fixed to the conductive pattern 126 through a bonding material such as solder.

The lead 127 is fixed to the pad provided on the periphery of the circuit board 122, and functions as an external connection terminal to let an input or output signal pass through. Referring to FIG. 7B, many leads 127 are provided along two opposite sides of the circuit board 122.

The sealing resin 124 is formed by transfer molding using the thermosetting resin. In FIG. 7B, the sealing resin 124 is used to seal the conductive pattern 126, the semiconductor element 130A, the chip element 130B and the fine metal wire 132. Then, the top, side and bottom surfaces of the circuit board 122 are coated with the sealing resin 124. The material of construction of the sealing resin 124 is the same as that of the above-mentioned resin sheet 110.

Further description will be given with reference to FIG. 7C with regard to the sealing resin 124. The sealing resin 124 is made of a first sealing resin 124A and a second sealing resin 124B. As seen in the drawing, the boundary between the first sealing resin 124A and the second sealing resin 124B is depicted; however, in an actual circuit device, the first and second sealing resins 124A and 124B are integrally formed. Although details will be described later, the first sealing resin 124A is formed by injecting a liquid resin into a cavity of a molding die, and the second sealing resin 124B is formed by melting a resin sheet placed on the bottom surface of the circuit board 122. The thickness T1 of the second sealing resin 124B coating the bottom surface of the circuit board 122 lies between 0.1 mm and 0.3 mm, both inclusive, for example, which is very thin. The thin second sealing resin 124B is low in thermal resistance, and thus, heat radiated from the circuit element such as the semiconductor element is excellently released to the outside via the circuit board 122 and the second sealing resin 124B.

In the third embodiment, the filler contained in the second sealing resin 124B is more uniformly dispersed than the filler contained in the first sealing resin 124A. Specifically, the first sealing resin 124A is formed by injecting the liquid resin into the cavity of the molding die. Therefore, the filler stays and is relatively dense in a region where the flow of the thermosetting resin in liquid form is inhibited. For example, in the region A1 where the chip element 130B or the semiconductor element 130A is disposed, the flow of the sealing resin in liquid form is inhibited by these elements, and thus, the filler is dense. On the other hand, in the region A2 where the circuit element such as the semiconductor element is not disposed, the flow of the sealing resin is smooth, and thus, the filler is relatively sparsely disposed as compared to the region A1 or the second sealing resin 124B.

On the other hand, the second sealing resin 124B coating the bottom surface of the circuit board 122 is formed by melting and heat-curing the resin sheet placed on the bottom surface of the circuit board 122, rather than by injection molding. Therefore, the second sealing resin 124B does not basically flow in the resin sealing process, and thus, the filler is relatively uniformly filled throughout the entire area of the second sealing resin 124B. Accordingly, the thermal resistance of the second sealing resin 124B is uniform throughout the entire area, and thus, heat radiation from the bottom surface of the circuit board 122 is good as a whole.

Referring to FIG. 7C, the entire area of the bottom surface of the circuit board 122 and a lower portion of the side surface thereof are coated with the second sealing resin 124B; however, the circuit board 122 may be such that only the bottom surface of the circuit board 122 is coated with the second sealing resin 124B, and the side and top surfaces of the circuit board 122 are coated with the first sealing resin 124A. Further, the circuit board 122 may be such that the vicinity of a central portion of the bottom surface of the circuit board 122 is coated with the second sealing resin 124B, and the surfaces of top, side and peripheral bottom of the circuit board 122 are coated with the first sealing resin 124A.

A method of manufacturing the hybrid integrated circuit device of the above-mentioned configuration will be described with reference to FIGS. 8A to 8C and FIGS. 9A and 9B.

Figure 8B:
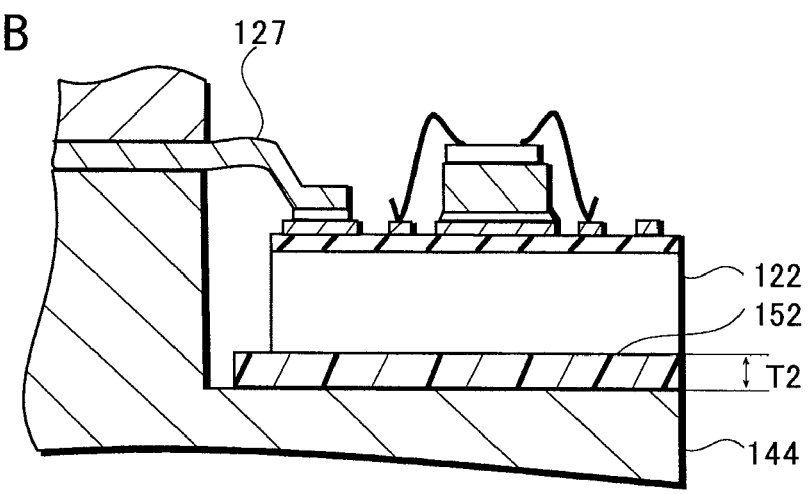
Figure 8C:
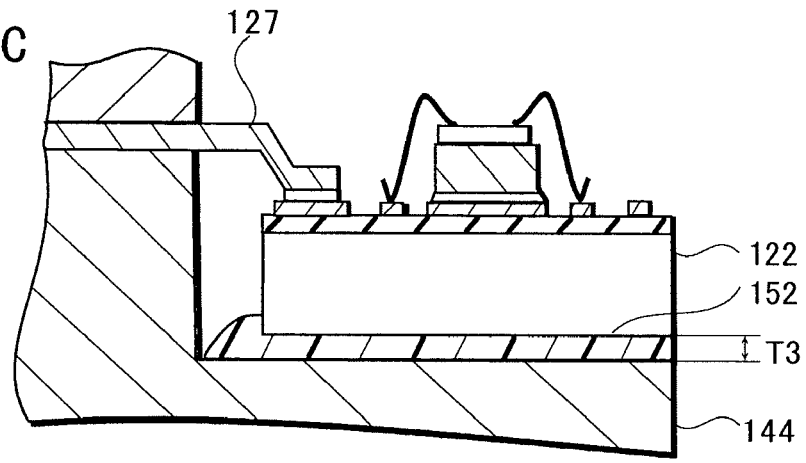

Referring to FIGS. 8A to 8C, first, the circuit board 122 having a hybrid integrated circuit embedded therein on its top surface is placed in the cavity 146 of the molding die 140. FIG. 8A is a cross-sectional view showing this process, FIG. 8B is an enlarged cross-sectional view showing the resin sheet 152 before melting, and FIG. 8C is an enlarged cross-sectional view showing the resin sheet 152 after melting.

Referring to FIG. 8A, the conductive pattern formed in a predetermined layout by etching is formed on the top surface of the circuit board 122 of a rectangular shape made of metal such as aluminum. Then, many circuit elements such as the semiconductor elements are fixed in a predetermined location on the conductive pattern thereby to form the hybrid integrated circuit.

Referring to FIG. 8B, here, the resin sheet 152 is mounted on the inner wall of the lower die 144, and subsequently, the circuit board 122 is mounted on the top surface of the resin sheet 152. Then, an upper die 142 and the lower die 144 are brought into contact with each other thereby to place the circuit board 122 within the cavity 146 (see FIG. 8A). Also, the leads 127 led out of both side edges of the circuit board 122 are sandwiched and fixed between the upper die 142 and the lower die 144. The leads 127 are sandwiched between the upper and lower dies as mentioned above thereby to fix the top and bottom positions and the right and left positions of the circuit board 122 in the cavity 146. Incidentally, at an early stage in this process, the resin sheet 152 is in a solid state of the thermosetting resin in granular form as press-molded. Also, the molding die 140 is equipped with a heater (not shown), and the molding die 140 is heated to a temperature (for example, 170° C. or higher) at which the resin sheet 152 is melted and heat-cured. Heating of the molding die 140 may be started before the mounting of the resin sheet 152, or may be started after the mounting of the resin sheet 152.

The thickness T2 of the resin sheet 152 is greater than the thickness (T1 shown in FIG. 7C) of the sealing resin coating the bottom surface of the circuit board 122 in the hybrid integrated circuit device 120 manufactured. Specifically, if the thickness T1 of the sealing resin shown in FIG. 7C lies between 0.1 mm and 0.3 mm, both inclusive, the thickness T2 of the resin sheet 152 is set to lie between 0.4 mm and 0.6 mm, both inclusive. On the other hand, as mentioned above, the position of the circuit board 122 in the cavity 146 is fixed by sandwiching the leads 127 between the upper and lower dies. Therefore, the shape and position of the lead 127 are set so that a distance between the bottom surface of the circuit board 122 and the top surface of the inner wall of the lower die 144 is equal to T1 (see FIG. 7C). Thus, when the resin sheet 152 and the circuit board 122 are superimposed and mounted on the lower die 144 and the leads 127 are sandwiched by the molding die 140, the leads 127 are elastically deformed by stress pressing and bending the leads 127 in a direction from top to bottom, and as a result, the resin sheet 152 is pressed against the lower die 144 and fixed by the bottom surface of the circuit board 122. In this drawing, there is shown the lead 127 elastically deformed by being sandwiched by the molding die 140.

The molding die 140 is heated as mentioned above, and thus, with the passage of time, the resin sheet 152 is melted and softened, and the bottom surface of the circuit board 122 is coated with the resin sheet 152 in liquid or semisolid form.

Also, referring to FIG. 8C, the elastically deformed lead 127 is sandwiched by the molding die as mentioned above, and thus, when the resin sheet 152 is softened and loses supporting force, the shape of the lead 127 is restored to its original state, and the circuit board 122 sinks downward. Then, as the circuit board 122 sinks, a portion of the softened resin sheet 152 moves from underneath the circuit board 122 to the side thereof, and coats the vicinity of a bottom end of the side surface of the circuit board 122. As mentioned above, the thickness T3 of the resin sheet 152 coating the bottom surface of the sunk circuit board 122 lies between 0.1 mm and 0.3 mm, both inclusive, for example, which is equivalent to the thickness T1 of the sealing resin shown in FIG. 7C.

Also, referring to FIG. 8A, the planar size of the resin sheet 152 is larger than that of the circuit board 122, and the periphery of the resin sheet 152 extends sideward beyond the circuit board 122. The planar size of the resin sheet 152 is larger than that of the circuit board 122 as mentioned above, and thereby, the bottom surface of the circuit board 122 is wholly coated with the molten resin sheet 152, and also, the circuit board 122, also inclusive of its side surface, is coated therewith.

Here, the planar size of the resin sheet 152 may be equivalent to that of the circuit board 122, or may be slightly smaller than that of the circuit board 122. If the resin sheet 152 is smaller in size than the circuit board 122, the vicinity of the central portion of the circuit board 122 is coated with the resin sheet 152, the vicinity of the bottom surface of the circuit board 122 is coated with resin to be injected in a later process.

Referring to FIG. 9A, then, the sealing resin is injected into the cavity 146. Specifically, a tablet 158 is loaded into a pod 150A provided in the lower die 144 and is heated and melted therein, and subsequently, the tablet 158 is pressed by a plunger 160. The tablet 158 has the same composition as the above-mentioned resin sheet 152, and is obtained by pressure-molding a thermosetting resin in powder form having an additive such as a filler mixed therein, into a //cylindrical form. As mentioned above, the molding die is heated to about 170° C. or higher, and thus, when the tablet 158 is loaded into the pod 150A, the tablet 158 is gradually melted. The molten sealing resin in liquid or semisolid form flows through a runner 148 and passes through the gate 154, and is then fed to the cavity 146. Hereinafter, the sealing resin fed through the gate 154 is called the first sealing resin 124A, and the sealing resin made of the molten resin sheet 152 is called the second sealing resin 124B.

Figure 9B:
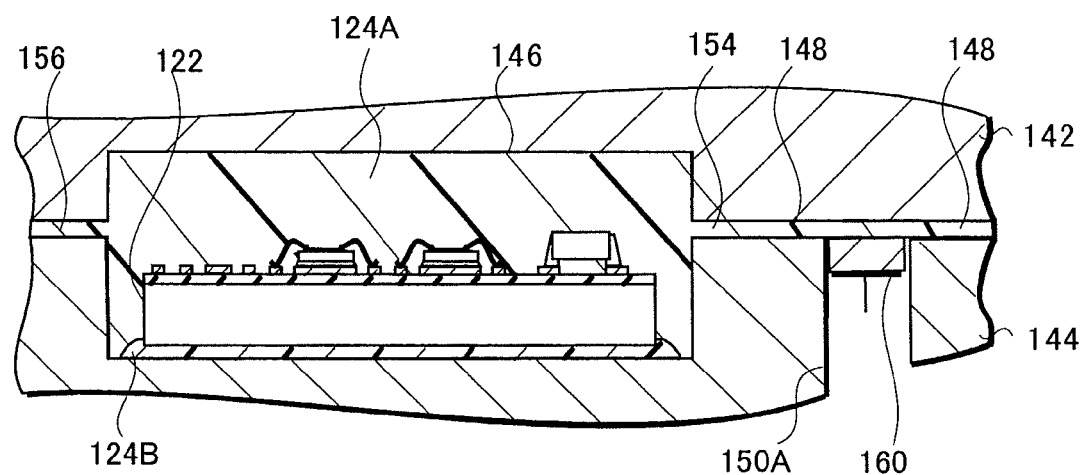

Referring to FIG. 9B, the injected first sealing resin 124A in liquid form is filled into the cavity 146. Here, the temperature of the molding die is higher than a temperature at which the first sealing resin 124A is heat-cured, and thus, the first sealing resin 124A filled into the cavity 146 is polymerized and cured with the passage of time. As shown in FIG. 9B, if the bottom surface of the circuit board 122 and a lower portion of the side surface thereof are coated with the second sealing resin 124B made of the resin sheet 152, the top surface of the circuit board 122 and an upper portion of the side surface thereof are coated with the first sealing resin 124A. On the other hand, if only the bottom surface of the circuit board 122 is coated with the second sealing resin 124B, the top and side surfaces of the circuit board 122 are wholly coated with the first sealing resin 124A. Also, if only the vicinity of the central portion of the bottom surface of the circuit board 122 is coated with the second sealing resin 124B, the surfaces of top, side and peripheral bottom of the circuit board 122 are coated with the first sealing resin 124A.

When both the first sealing resin 124A and the second sealing resin 124B are sufficiently polymerized and heat-cured by being heated in the molding die, the upper die 142 and the lower die 144 are separated from each other, and the hybrid integrated circuit device as a molded product is removed. After that, the partial sealing resin 124 filled into an air vent 156 and the runner 148 is separated from a main body of the sealing resin 124.

Referring to FIG. 9B, there is shown the boundary between the first sealing resin 124A and the second sealing resin 124B. However, the second sealing resin 124B filled into the bottom surface of the circuit board 122 and the first sealing resin 124A injected through the gate 154 are integrally formed because of being mixed together in liquid or semisolid form. In other words, in the hybrid integrated circuit device actually manufactured by this method, the boundary portion between the first sealing resin 124A and the second sealing resin 124B is not visually observed. Here, the time required for the first sealing resin 124A and the second sealing resin 124B to cure after melting lies between about 10 and 20 seconds.

In this process, the second sealing resin 124B into which the resin sheet 152 is heat-cured prior to the first sealing resin 124A injected through the gate 154. In so doing, pressure is applied to the boundary portion between the first sealing resin 124A and the second sealing resin 124B by cure shrinkage of the first sealing resin 124A coating most of the circuit board 122, thereby to permit ensuring the moisture resistance in the boundary portion. On the other hand, if the second sealing resin 124B undergoes cure shrinkage after the first sealing resin 124A, a crack occurs in the above-mentioned boundary portion by the cure shrinkage acting on the second sealing resin 124B, which can possibly lead to deterioration in the moisture resistance.

Methods for curing the second sealing resin 124B prior to the first sealing resin 124A include a method that involves adjusting heating time of these resins, and a method that involves adjusting the compositions of the resins. In the above-mentioned embodiment, the resin sheet 152 to form the second sealing resin 124B is heated in the cavity 146 prior to the first sealing resin 124A, and thereafter, the tablet 158 to form the first sealing resin 124A is loaded into the pod 150A. Also, for the adjustment of the compositions of the resins, the thermosetting resin requiring a shorter time for heat curing than the thermosetting resin contained in the tablet 158 is used as the thermosetting resin contained in the resin sheet 152. In this instance, the timing of start of heating of the resin sheet 152 may be the same as that of the tablet 158.

Fourth Embodiment

In the fourth embodiment, description will be given with regard to the resin sheet 110 according to the third embodiment as applied to a sealing resin that forms a circuit device of a lead frame type.

Description will be given with reference to FIGS. 10A and 10B with regard to a configuration of the circuit device 170 manufactured by the circuit device manufacturing method according to the present invention. FIG. 10A is a plan view of the circuit device 170, and FIG. 10B is a cross-sectional view thereof.

Referring to FIGS. 10A and 10B, the circuit device 170 includes the semiconductor element 180, the island 172 having the semiconductor element 180 mounted thereon, a lead 178 connected via a fine metal wire 182 to the semiconductor element 180, and a sealing resin 174 that integrally resin-seals these.

The semiconductor element 180 is an IC, an LSI or a discrete transistor having many electrodes formed on a top surface, for example, and is fixed on the top surface of the island 172. The planar size of the semiconductor element 180 may possibly be equal to or more than 10 mm×10 mm, if an LSI having a large-scale electric circuit embedded therein is used as the semiconductor element 180. The back surface of the semiconductor element 180 is fixed on the top surface of the island 172 through a conductive bonding material such as solder or conductive paste, or an insulating bonding material such as an epoxy resin.

The island 172 is formed in a rectangular shape in the vicinity of the center of the circuit device 170, and is formed slightly larger than the semiconductor element 180 fixed on the top surface of the island 172. For example, if the size of the semiconductor element 180 fixed on the top surface of the island 172 is 10 mm×10 mm, the size of the island 172 is of the order of 12 mm×12 mm. Also, the back surface of the island 172 is coated with a thin coating of the sealing resin 174. Further, suspension leads 186 extend outwardly from four corners of the island 172, and the suspension leads 186 serve to mechanically support the island 172 in the manufacturing process.

Each of the leads 178 is connected via the fine metal wire 182 to the electrode of the semiconductor element 180, and is exposed at one end to the outside from the sealing resin 174. Here, many leads 178 are arranged around the semiconductor element 180.

The sealing resin 174 is formed by transfer molding using the thermosetting resin. In FIG. 10B, the sealing resin 174 is used to coat the semiconductor element 180, the fine metal wire 182, a portion of the lead 178, and the side and bottom surfaces of the island 172. The composition of the sealing resin 174 may be the same as the above-mentioned second embodiment.

Referring to FIG. 10B, the sealing resin 174 is made of a first sealing resin 174A and a second sealing resin 174B. As seen in the drawing, the boundary between the first sealing resin 174A and the second sealing resin 174B is depicted; however, in an actual circuit device, the first and second sealing resins 174A and 174B are integrally formed. Although details will be described later, the first sealing resin 174A is formed by injecting a liquid resin into a cavity of a molding die, and the second sealing resin 174B is formed by melting a resin sheet placed on the bottom surface of the island 172. A thickness T4 of the second sealing resin 174B coating the bottom surface of the island 172 lies between 0.1 mm and 0.3 mm, both inclusive, for example, which is very thin. The thin second sealing resin 174B is low in thermal resistance, and thus, heat radiated from the semiconductor element 180 is excellently released to the outside via the island 172 and the second sealing resin 174B.

In the fourth embodiment, the filler contained in the second sealing resin 174B is more uniformly dispersed than the filler contained in the first sealing resin 174A. Specifically, the first sealing resin 174A is formed by injecting the liquid resin into the cavity of the molding die. Therefore, the filler stays and is relatively dense in a region where the flow of the thermosetting resin in liquid form is inhibited. For example, in the region A1 where the semiconductor element 180 or the fine metal wire 182 is disposed, the flow of the sealing resin in liquid form is inhibited by these elements, and thus, the filler is dense. On the other hand, in the region A2 where the semiconductor element is not disposed, the flow of the sealing resin is smooth, and thus, the filler is relatively sparsely disposed as compared to the region A1 or the second sealing resin 174B. Therefore, this can possibly lead to local deterioration in thermal conductivity in the second region A2 of the first sealing resin 174A.

On the other hand, the second sealing resin 174B coating the bottom surface of the island 172 is formed by melting and heat-curing the resin sheet placed on the bottom surface of the island 172, rather than by injection molding. Therefore, the second sealing resin 174B does not basically flow in the resin sealing process, and thus, the filler is relatively uniformly filled throughout the entire area of the second sealing resin 174B. Thus, the thermal resistance of the second sealing resin 174B is uniform throughout the entire area, and thus, heat radiation from the bottom surface of the island 172 is good as a whole.

Referring to FIG. 10B, the entire area of the bottom surface of the island 172 and a lower portion of the side surface thereof are coated with the second sealing resin 174B; however, the island 172 may be such that only the bottom surface of the island 172 is coated with the second sealing resin 174B, and the surfaces of side and peripheral top of the island 172 is coated with the first sealing resin 174A. Further, the island 172 may be such that the vicinity of a central portion of the bottom surface of the island 172 is coated with the second sealing resin 174B, and the periphery of the top surface of the island 172, the side surface thereof and the periphery of the bottom surface thereof are coated with the first sealing resin 174A.

A circuit device manufacturing method of the above-mentioned configuration will be described with reference to FIGS. 11A to 13B.

Figure 11A:
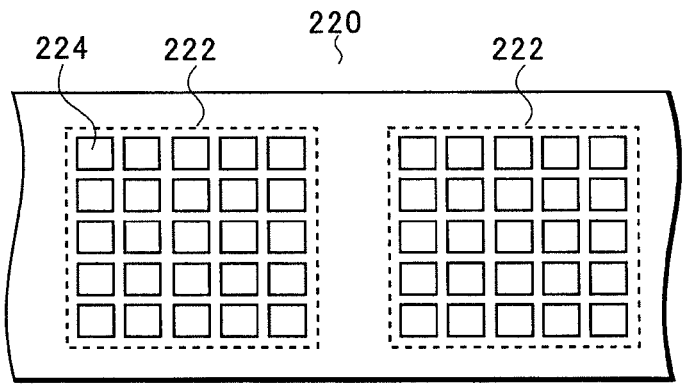
FIGS. 11A, 11B and 11C are a plan view, an enlarged plan view, and a cross-sectional view, respectively, showing the circuit device manufacturing method according to the present invention.
Figure 11B:
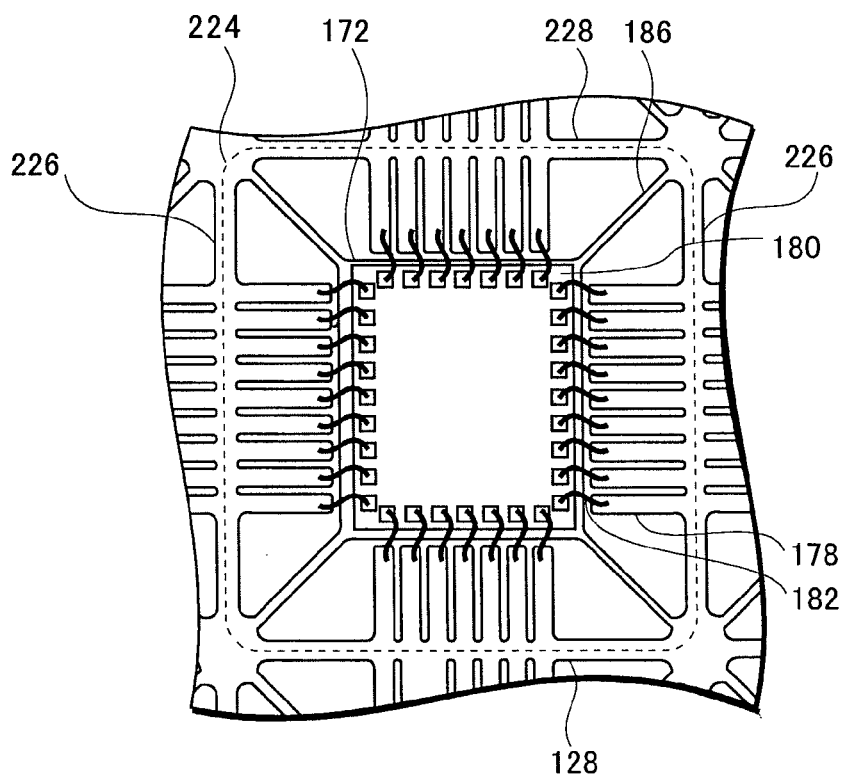
Figure 11C:
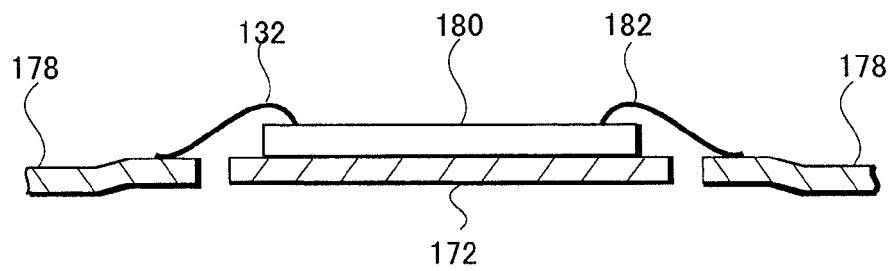

Referring to FIGS. 11A to 11C, first, a lead frame 220 of a predetermined shape is prepared, and the semiconductor element 180 is connected to each of units 224 formed on the lead frame 220. FIG. 11A is a plan view showing the lead frame 220, FIG. 11B is a plan view showing the unit 224 contained in the lead frame 220, and FIG. 11C is a cross-sectional view of the unit 224.

Referring to FIG. 11A, the lead frame 220 is formed in the predetermined shape by subjecting a metal sheet made of metal such as copper having a thickness on the order of 0.3 mm to an etching process or a press molding process. Also, the lead frame 220 is rectangular in general shape. The lead frame 220 has an arrangement of plural blocks 222 spaced from each other.

Referring to FIG. 11B, linkage portions 226 and 228 extend vertically and horizontally, respectively, in a grid pattern in the block 222. Then, the unit 224 is formed in a region surrounded by the linkage portions 226 and 228. Specifically, the leads 178 integrally extend inwardly of the unit 224 from the linkage portions 226 and 228. Then, the island 172 of a square shape is formed in the vicinity of the center of the unit 224, and four corners of the island 172 are continuous with the linkage portions 226 and 228 through the suspension leads 186. Here, the typical leads 178 may be used as linking means for linking the island 172 to the linkage portions.

Referring to FIG. 11C, the semiconductor element 180 is fixed on the top surface of the island 172 contained in each individual unit 224. The electrodes provided on the top surface of the semiconductor element 180 are connected to the leads 178 via the fine metal wires 182.

Figure 12B:
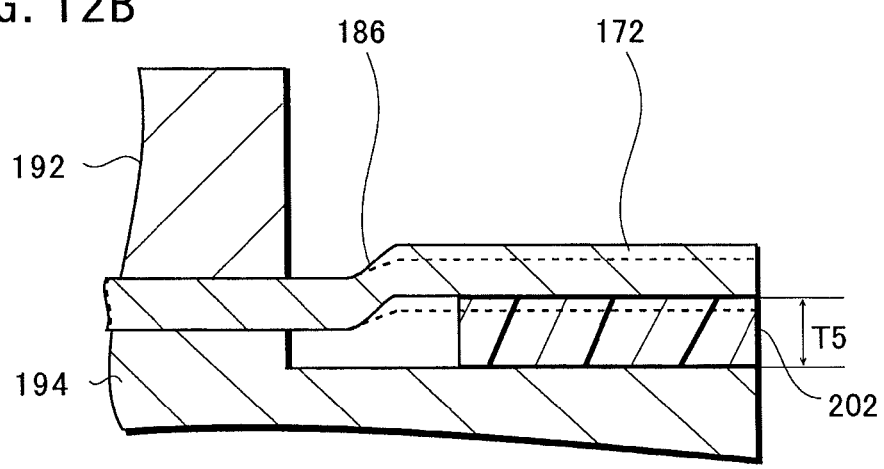
Figure 12C:
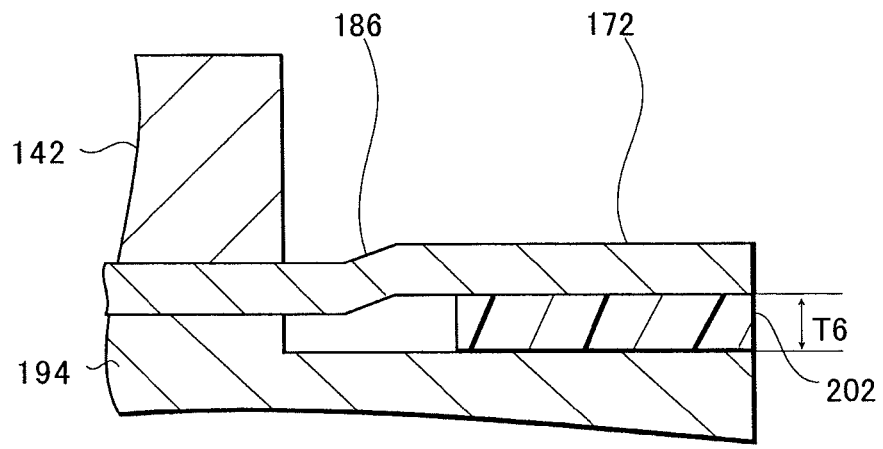

Referring to FIGS. 12A to 12C, then, the island 172 having the semiconductor element 180 fixed on the top surface is placed in a cavity 196 of a molding die 190. FIG. 12A is a cross-sectional view showing this process, FIG. 12B is an enlarged cross-sectional view showing the resin sheet 202 before melting, and FIG. 12C is an enlarged cross-sectional view showing the resin sheet 202 after melting.

Referring to FIG. 12A, here, the resin sheet 202 is mounted on the bottom surface of the inner wall of the lower die 194, and subsequently, the island 172 is mounted on the top surface of the resin sheet 202. Then, an upper die 192 and the lower die 194 are brought into contact with each other thereby to place the island 172 within the cavity 196. Also, the suspension leads 186 extending continuously from the island 172 are sandwiched and fixed between the upper die 192 and the lower die 194. The suspension leads 186 are sandwiched between the upper and lower dies as mentioned above thereby to fix the top and bottom positions and the right and left positions of the island 172 in the cavity 196. Incidentally, at an early stage in this process, the resin sheet 202 is in a solid state of the resin material in granular form as press-molded. Also, the molding die 190 is equipped with a heater (not shown), and the molding die 190 is heated to a temperature (for example, 170° C. or higher) at which the resin sheet 202 is melted and heat-cured. Heating of the molding die 190 may be started before the mounting of the resin sheet 202, or may be started after the mounting of the resin sheet 202.

The composition of the resin sheet 202 may be the same as the sealing resin injected into the cavity 196 of the molding die, or may be different therefrom. For example, the proportion of filler contained in the resin sheet 202 may be higher than that of the sealing resin to be injected later, in order to achieve good heat radiation from the back surface of the island 172.

Referring to FIG. 12B, a thickness T5 of the resin sheet 202 is greater than the thickness (T4 shown in FIG. 10C) of the sealing resin coating the bottom surface of the island 172 in the circuit device 170 manufactured. Specifically, if the thickness T4 of the sealing resin shown in FIG. 10C lies between 0.1 mm and 0.3 mm, both inclusive, the thickness T5 of the resin sheet 202 is set to lie between 0.5 mm and 0.6 mm, both inclusive. On the other hand, as mentioned above, the position of the island 172 in the cavity 196 is fixed by sandwiching the suspension leads 186 between the upper and lower dies. Therefore, the shape and position of the suspension lead 186 are set so that a distance between the bottom surface of the island 172 and the top surface of the inner wall of the lower die 194 is equal to T4 (see FIG. 10B). Thus, when the resin sheet 202 and the island 172 are superimposed and mounted on the lower die 194 and the suspension leads 186 are sandwiched by the molding die 190, the suspension leads 186 are elastically deformed by the upper die 192 applying stress to the leads 186 and thereby pressing and bending the leads 186 in a direction from top to bottom, and as a result, the resin sheet 202 is pressed against the lower die 194 and fixed by the bottom surface of the island 172. In this drawing, there is shown the suspension lead 186 elastically deformed by being sandwiched by the molding die 186. Also, the shape of the suspension lead 186 when not deformed is shown by the dotted lines.

The molding die 190 is heated as mentioned above, and thus, with the passage of time, the resin sheet 202 is melted and softened, and the bottom surface of the island 172 is coated with the resin sheet 202 in liquid or semisolid form.

Also, referring to FIG. 12C, the elastically deformed suspension lead 186 is sandwiched by the molding die as mentioned above, and thus, when the resin sheet 202 is softened and loses supporting force, the shape of the suspension lead 186 is restored to its original state, and the island 172 sinks downward. Then, as the island 172 sinks, a portion of the softened resin sheet 202 moves from underneath the island 172 to the side thereof, and coats the vicinity of the bottom end of the side surface of the island 172 (see FIG. 10B). As mentioned above, a thickness T6 of the resin sheet 202 coating the bottom surface of the sunk island 172 lies between 0.1 mm and 0.3 mm, both inclusive, for example, which is equivalent to the thickness T4 of the sealing resin shown in FIG. 10B.

Also, the planar size of the resin sheet 202 is larger than that of the island 172, and the periphery of the resin sheet 202 extends sideward beyond the island 172. The planar size of the resin sheet 202 is larger than that of the island 172 as mentioned above, and thereby, the bottom surface of the island 172 is wholly coated with the molten resin sheet 202, and also, the island 172, also inclusive of its side surface, is coated therewith.

Here, the planar size of the resin sheet 202 may be equivalent to that of the island 172, or may be slightly smaller than that of the island 172. If the resin sheet 202 is smaller in size than the island 172, the vicinity of the central portion of the bottom surface of the island 172 is coated with the resin sheet 202.

Figure 13A:
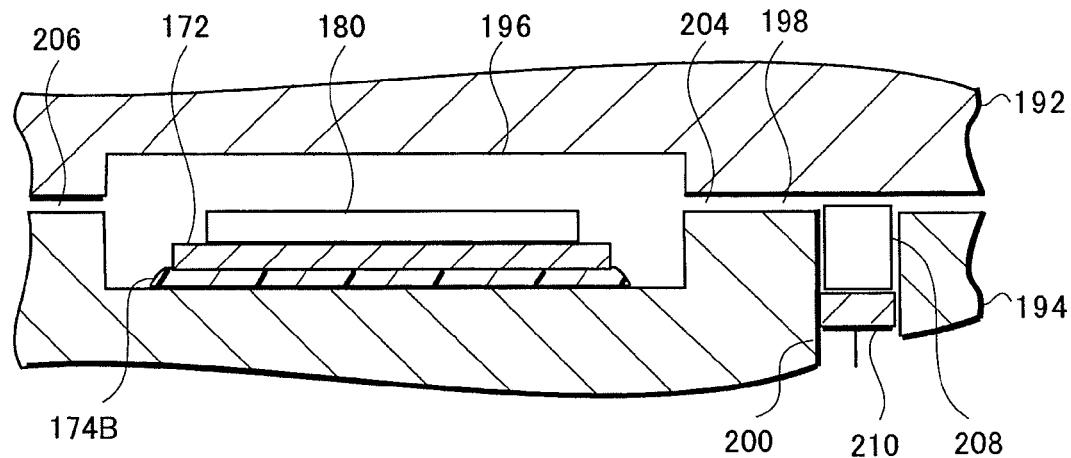
FIGS. 13A and 13B are cross-sectional views showing the circuit device manufacturing method according to the present invention.

Referring to FIG. 13A, then, the sealing resin is injected into the cavity 196. Specifically, a tablet 208 is loaded into a pod 200 provided in the lower die 194 and is heated and melted therein, and subsequently, the tablet 208 is pressed by a plunger 210. The tablet 208 has the same composition as the above-mentioned resin sheet 202, and is obtained by pressure-molding a thermosetting resin in powder form having an additive such as a filler mixed therein, into the form of a cylinder having a height on the order of a few centimeters. As mentioned above, the molding die is heated to about 170° C. or higher, and thus, when the tablet 208 is loaded into the pod 200, the tablet 208 is gradually melted. The molten sealing resin in liquid or semisolid form flows through a runner 198 and passes through a gate 204, and is then fed to the cavity 196. Hereinafter, the sealing resin fed through the gate 204 is called the first sealing resin 174A, and the sealing resin made of the molten resin sheet 202 is called the second sealing resin 174B.

Figure 13B:
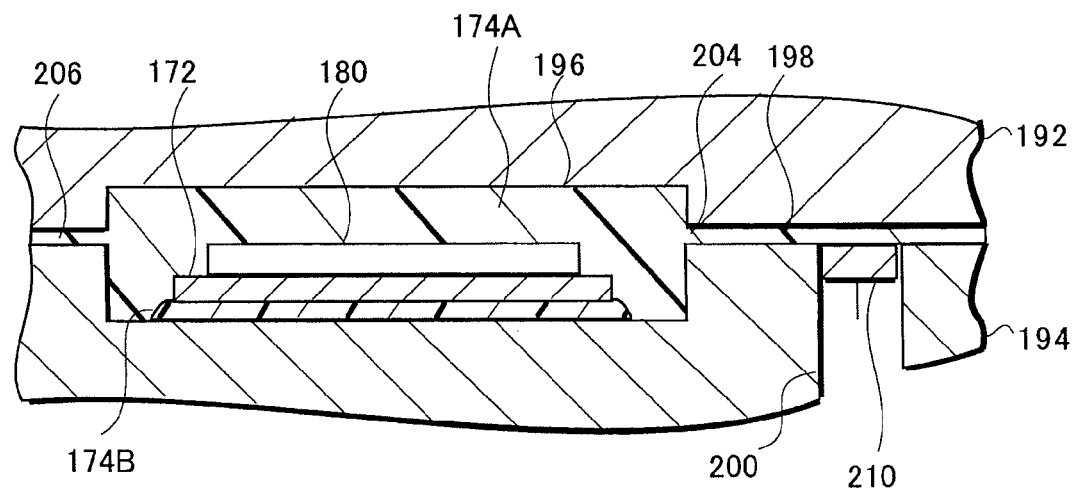

Referring to FIG. 13B, the injected first sealing resin 174A in liquid form is filled into the cavity 196. Here, the temperature of the molding die is higher than a temperature at which the first sealing resin 174A is heat-cured, and thus, the first sealing resin 174A filled into the cavity 196 is polymerized and cured with the passage of time. The second sealing resin 174B, as well as the first sealing resin 174A, is polymerized and then cured. As shown in FIG. 13B, if the bottom surface of the island 172 and a lower portion of the side surface thereof are coated with the second sealing resin 174B made of the resin sheet 202, the periphery of the top surface of the island 172 and an upper portion of the side surface thereof are coated with the first sealing resin 174A. On the other hand, if only the bottom surface of the island 172 is coated with the second sealing resin 174B, the periphery of the top surface of the island 172 and the side surface thereof are wholly coated with the first sealing resin 174A. Also, if only the vicinity of the central portion of the bottom surface of the island 172 is partially coated with the second sealing resin 174B, the periphery of the top surface of the island 172, the side surface thereof and the periphery of the bottom surface thereof are coated with the first sealing resin 174A.

When both the first sealing resin 174A and the second sealing resin 174B are sufficiently polymerized and heat-cured by being heated in the molding die, the upper die 192 and the lower die 194 are separated from each other, and the circuit device as a molded product is removed. After that, the partial sealing resin 174 filled into an air vent 206 and the runner 198 is separated from a main body of the sealing resin 174.

Referring to FIG. 13B, there is shown the boundary between the first sealing resin 174A and the second sealing resin 174B. However, the second sealing resin 174B filled into the bottom surface of the island 172 and the first sealing resin 174A injected through the gate 204 are integrally formed because of being mixed together in liquid or semisolid form. Here, the time required for the first sealing resin 174A and the second sealing resin 174B to cure after melting lies between about 10 and 20 seconds.

In this process, the second sealing resin 174B made of the molten resin sheet 202 is heat-cured prior to the first sealing resin 174A injected through the gate 204. In so doing, pressure is applied to the boundary portion between the first sealing resin 174A and the second sealing resin 174B by cure shrinkage of the first sealing resin 174A coating most of the island 172, thereby to permit ensuring the moisture resistance in the boundary portion.

Methods for curing the second sealing resin 174B prior to the first sealing resin 174A include a method that involves adjusting heating time of these resins, and a method that involves adjusting the compositions of the resins. In the above-mentioned embodiment, the heating time is adjusted. Specifically, the resin sheet 202 to form the second sealing resin 174B is heated in the cavity 196 prior to the first sealing resin 174A, and thereafter, the tablet 208 to form the first sealing resin 174A is loaded into the pod 200. Also, for the adjustment of the compositions of the resins, the thermosetting resin requiring a shorter time for heat curing than the thermosetting resin contained in the tablet 208 is used as the thermosetting resin contained in the resin sheet 202. In this instance, the timing of start of heating of the resin sheet 202 may be the same as that of the tablet 208.

By the above processes, the circuit device 170 shown in FIGS. 10A and 10B is manufactured.

Fifth Embodiment

Figure 14A:
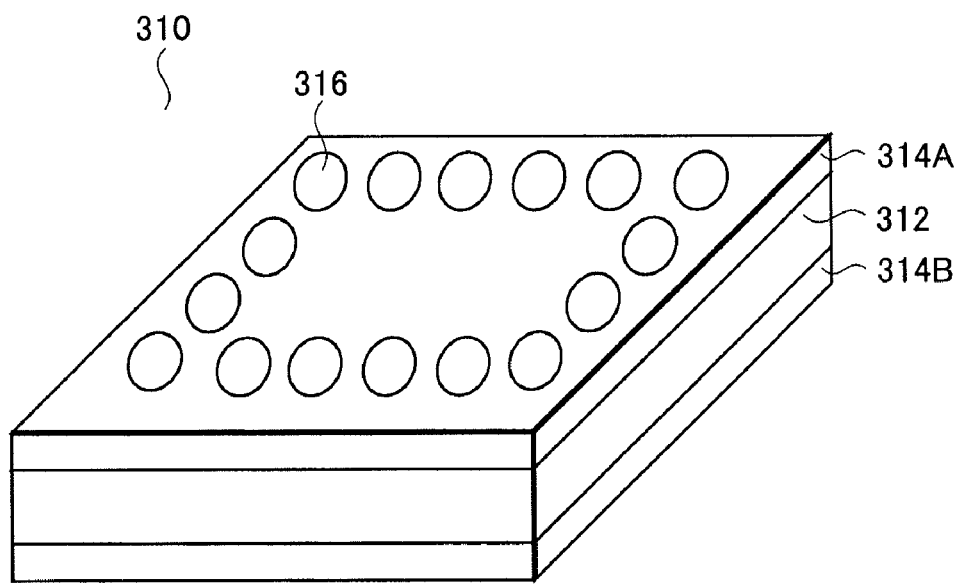
FIGS. 14A and 14B are a perspective view and a cross-sectional view, respectively, showing a circuit device as manufactured by a circuit device manufacturing method according to the present invention.
Figure 14B:
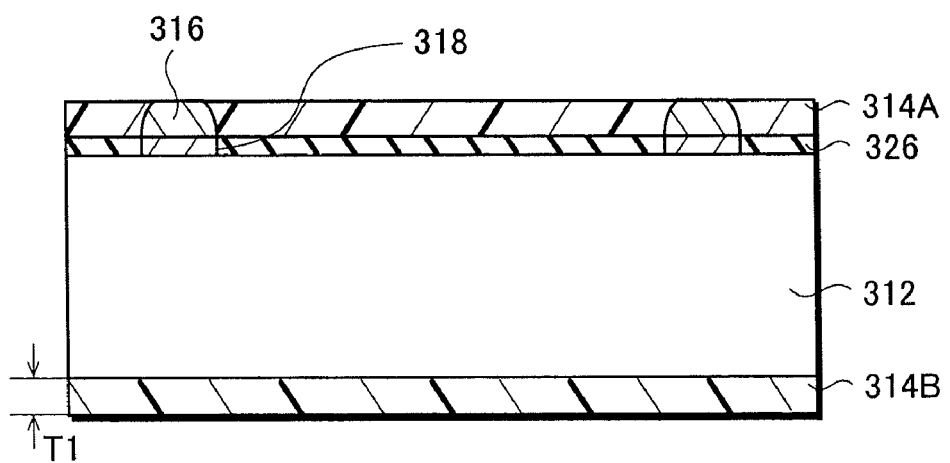

Description will be given with reference to FIGS. 14A and 14B with regard to a configuration of a circuit device 310 manufactured by a manufacturing method according to the fifth embodiment. FIG. 14A is a perspective view of the circuit device 310, and FIG. 14B is a typical cross-sectional view thereof. The circuit device 310 is a surface mount package called CSP or WLP, which is equivalent in overall size to a semiconductor element.

Referring to FIG. 14A, the circuit device 310 mainly includes a semiconductor element 312 (or a semiconductor substrate), an external connection electrode 316 provided on the top surface of the semiconductor element 312, a first sealing resin 314A that coats the top surface of the semiconductor element 312, exclusive of locations where the external connection electrodes 316 are provided, and a second sealing resin 314B that coats the bottom surface of the semiconductor element 312.

The semiconductor element 312 is made of a semiconductor material such as silicon and has a diffusion region formed on the top surface, and the diffusion region serves to implement a predetermined electric circuit. The semiconductor element 312 may be configured as a discrete transistor such as a bipolar transistor, or may be configured as an LSI having many transistors or the like formed thereon.

Referring to FIG. 14B, the top surface of the semiconductor element 312 is coated with an insulating film 326 made of a PSG (phospho-silicate-glass) film or a $Si_3N_4$ (silicon nitride) film. Then, a pad 318 made of a metal film is formed in an opening region partially formed in the insulating film 326.

The external connection electrode 316 is the electrode formed on the top surface of the pad 318, and its upper end is exposed to the outside from the first sealing resin 314A. The external connection electrode 316 is a gold bump or the like connected by wire bonding. Further, a solder ball may be melted to the top surface of the external connection electrode 316 exposed to the outside from the first sealing resin 314A.

The first sealing resin 314A is made of a thermosetting resin having an additive such as a filler added thereto, and coats the top surface of the insulating film 326 and the side surface of the external connection electrode 316. The thickness of the first sealing resin 314A is equivalent to the height of the external connection electrode 316, which is of the order of 0.1 mm, for example.

An epoxy resin, orthocresol novolak biphenyl, dicyclopentadiene, or the like is used as the thermosetting resin to form the first sealing resin 314A. Also, the first sealing resin 314A has the filler mixed therein for purposes of a reduction in heat resistance, or the like. The percentage of the filler mixed in the first sealing resin 314A lies between 70 wt % and 90 wt %, both inclusive, for example. A mixture of crystal silica and crushed silica is used as the type of filler; however, fused silica, alumina or silicon nitride may be used. Further, an average particle diameter of the filler mixed lies between 20 µm and 30 µm, both inclusive, for example.

The second sealing resin 314B is a resin layer that coats wholly the bottom surface of the semiconductor element 312, and its specific composition may be the same as that of the above-mentioned first sealing resin 314A. The thickness T1 of the second sealing resin 314B lies between about 0.1 mm and 0.3 mm, both inclusive, for example. The second sealing resin 314B protects the bottom surface of the semiconductor element 312 thereby to prevent a crack in the semiconductor element 312 in the transporting process or the mounting process. Further, the second sealing resin 314B also enables an improvement in the stiffness of the device as a whole, even if the semiconductor element 312 is extremely thinly formed.

Furthermore, the second sealing resin 314B has a large amount of filler mixed therein, thus enabling good outward radiation of heat produced by operation of the semiconductor element 312 via the second sealing resin 314B. The second sealing resin 314B, in particular, is formed by melting the resin sheet in the form of sheet, rather than by injection molding, and thus, the filler therein is more uniformly dispersed than that in the first sealing resin 314A, and the heat resistance thereof is uniform as a whole.

A circuit device manufacturing method of the above-mentioned configuration will be described with reference to FIGS. 15A to 18.

Figure 15A:
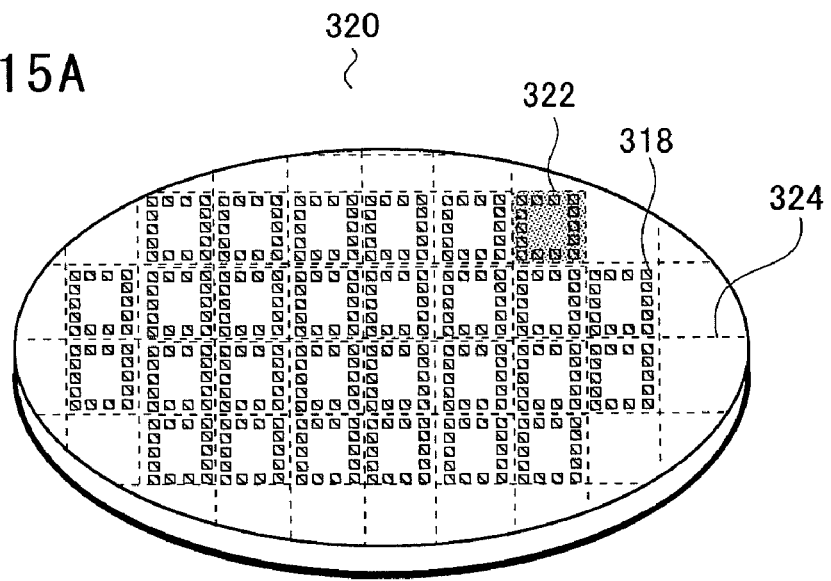
FIGS. 15A and 15B are a perspective view and a cross-sectional view, respectively, showing the circuit device manufacturing method according to the present invention.
Figure 15B:
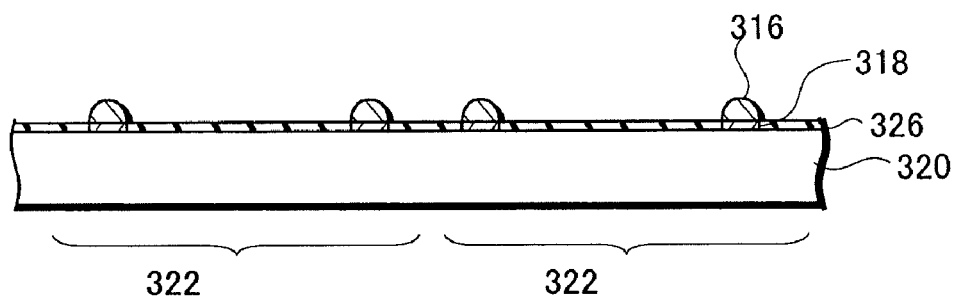

Referring to FIGS. 15A and 15B, first, a semiconductor wafer 320 having a predetermined circuit configured thereon and having the external connection electrode 316 formed thereon is prepared. FIG. 15A is a perspective view of the semiconductor wafer 320, and FIG. 15B is a cross-sectional view of the semiconductor wafer 320.

Referring to FIG. 15A, the semiconductor wafer 320 is a substrate made of a semiconductor material such as silicon, and semiconductor element units 322 are formed in a matrix on the top surface of the semiconductor wafer 320 through a diffusion process or the like. Also, the pads 318 connected to each integrated circuit are formed on the periphery of each of the semiconductor element units 322. As employed here, the semiconductor element unit 322 refers to a part that forms one circuit device. Also, a dicing line 324 is defined between the semiconductor element units 322, and at the time of a later process for dividing the semiconductor wafer 320, dicing is performed along the dicing line 324.

Referring to FIG. 15B, the top surface of the semiconductor wafer 320 is wholly coated with the insulating film 326, and the pad 318 made of metal such as copper or aluminum is formed in the opening region partially formed in the insulating film 326. The projecting external connection electrode 316 is formed on the top surface of the pad 318. As a method for forming the external connection electrode 316, wire bonding may be used to form the Au (gold) bump, or the electrode in the form of ball made of metal such as Au may be provided. Further, a bump in the form of projection made of other metallic materials may be used as the external connection electrode 316.

Figure 16A:
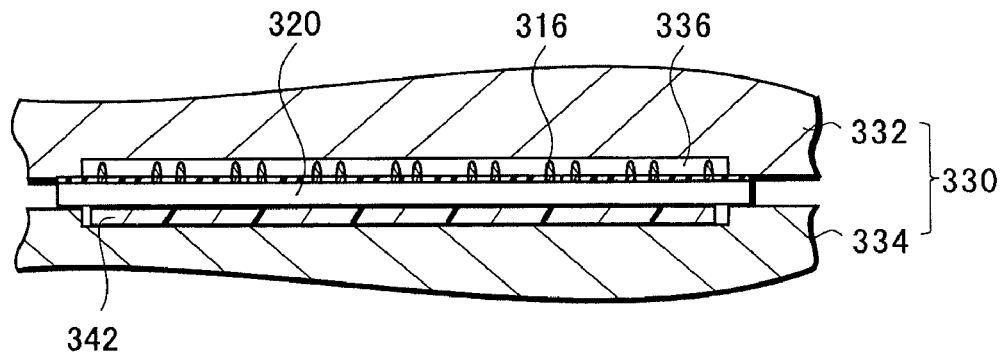
FIG. 16A and FIGS. 16B and 16C are a cross-sectional view and enlarged cross-sectional views, respectively, showing the circuit device manufacturing method according to the present invention.
Figure 16B:
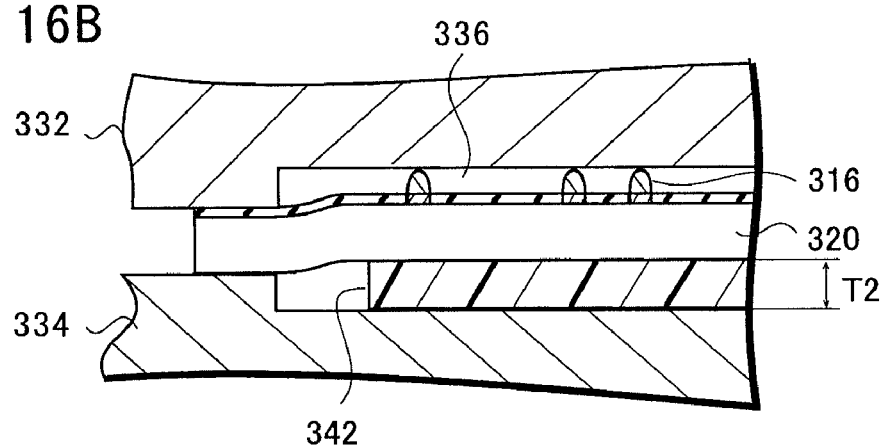
Figure 16C:
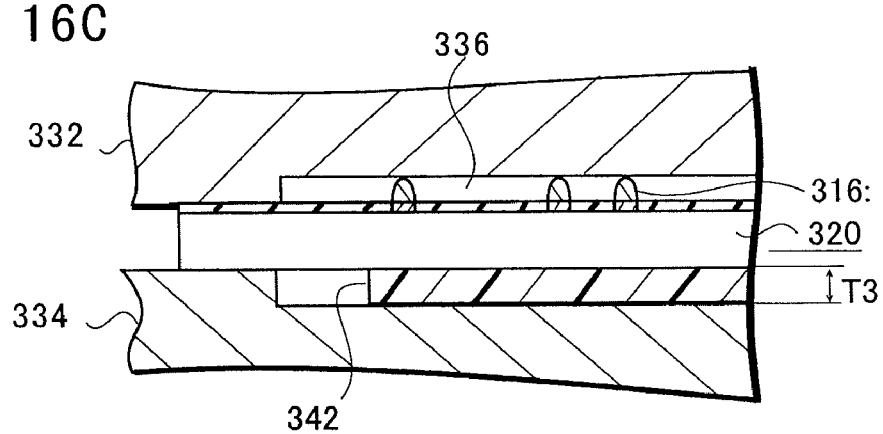

Referring to FIGS. 16A to 16C, then, the semiconductor wafer 320 is placed in a cavity 336 of a molding die 330. FIG. 16A is a cross-sectional view showing this process, FIG. 16B is an enlarged cross-sectional view of a resin, sheet 342 before melting, and FIG. 16C is an enlarged cross-sectional view of the resin sheet 342 after melting.

Referring to FIG. 16A, here, the resin sheet 342 is mounted on a bottom surface of an inner wall of a lower die 334, and thereafter, the semiconductor wafer 320 is mounted on the top surface of the resin sheet 342. Here, the bottom surface of the semiconductor wafer, which is a flat surface on which the external connection electrodes 316 are not formed, is in surface contact with the resin sheet 342.

Then, an upper die 332 and the lower die 334 are brought into contact with each other thereby to place the semiconductor wafer 320 in the cavity 336. Then, the periphery of the semiconductor wafer 320, which has not undergone the diffusion process for the formation of the semiconductor element units, is sandwiched and fixed between the upper die 332 and the lower die 334. The semiconductor wafer 320 is sandwiched between the upper and lower dies as mentioned above thereby to fix the top and bottom positions and the right and left positions of the semiconductor wafer 320 in the cavity 336. Incidentally, at an early stage in this process, the resin sheet 342 is in a solid state of the thermosetting resin in granular form as press-molded. Also, the molding die 330 is equipped with a heater (not shown), and the molding die 330 is heated to a temperature (for example, 170° C. or higher) at which the resin sheet 342 is melted and heat-cured. Heating of the molding die 330 may be started before the mounting of the resin sheet 342, or may be started after the mounting of the resin sheet 342.

Description will now be given with regard to the resin sheet 342 coating the bottom surface of the semiconductor wafer 320. The resin sheet 342 is melted and heat-cured thereby to form part of the sealing resin coating the semiconductor wafer 320. Specifically, the resin sheet 342 is obtained by pressure-molding a thermosetting resin in powder form having a filler, a curing agent or the like added thereto, into a sheet form of a predetermined shape. The composition of the resin sheet 342 may be the same as the sealing resin injected into the cavity 336 of the molding die, or may be different therefrom. For example, the proportion of filler contained in the resin sheet 342 may be higher than that of the sealing resin to be injected later, in order to achieve good heat radiation from the back surface of the semiconductor element manufactured. Here, the thermosetting resin in granular form that forms the resin sheet 342 is in the form of granule having a diameter of 1 mm or less.

Also, the resin sheet 342 is pressure molded at ordinary temperatures at extremely high pressure, and thus, the percentage of filling (i.e., the percentage of volume of a structural element such as resin powder relative to the whole of the resin sheet 342) is of the order of 99%, which is higher than a tablet to be described later. Therefore, an extremely small amount of air is contained in the resin sheet 342, which in turn suppresses the occurrence of a void in the sealing resin coating the bottom surface of the semiconductor wafer 320.

Referring to FIG. 16B, the thickness T2 of the resin sheet 342 is greater than the thickness (T1 shown in FIG. 14B) of the sealing resin coating the bottom surface of the semiconductor element 312 in the circuit device 310 manufactured. Specifically, if the thickness T1 of the sealing resin shown in FIG. 14B lies between 0.1 mm and 0.3 mm, both inclusive, the thickness T2 of the resin sheet 342 is set to lie between 0.5 mm and 0.6 mm, both inclusive. On the other hand, as mentioned above, the position of the semiconductor wafer 320 in the cavity 336 is fixed by sandwiching the semiconductor wafer 320 between the upper and lower dies. Therefore, the shape of the molding die 330 is set so that a distance between the bottom surface of the semiconductor wafer 320 and the top surface of the inner wall of the lower die 334 is equal to T1 (see FIG. 14B). Thus, when the resin sheet 342 and the semiconductor wafer 320 are superimposed and mounted on the lower die 334 and the semiconductor wafer 320 is sandwiched by the molding die 330, the semiconductor wafer 320 is elastically deformed by the upper die 332 applying stress to the semiconductor wafer 320 and thereby pressing and bending the semiconductor wafer 320 in a direction from top to bottom. As a result, the resin sheet 342 is pressed against the lower die 334 and fixed by the bottom surface of the semiconductor wafer 320. In this drawing, there is shown, in exaggerated form, the semiconductor wafer 320 elastically deformed by being sandwiched by the molding die 330.

The molding die 330 is heated as mentioned above, and thus, with the passage of time, the resin sheet 342 is melted and softened, and the bottom surface of the semiconductor wafer is coated with the resin sheet 342 in liquid or semisolid form.

Also, referring to FIG. 16C, the elastically deformed semiconductor wafer 320 is sandwiched by the molding die 330 as mentioned above, and thus, when the resin sheet 342 is softened and loses supporting force, the shape of the semiconductor wafer 320 is restored to its original state, and the semiconductor wafer 320 sinks downward. As mentioned above, the thickness T3 of the resin sheet 342 coating the bottom surface of the sunk semiconductor wafer 320 lies between 0.1 mm and 0.3 mm, both inclusive, for example, which is equivalent to the thickness T1 of the sealing resin shown in FIG. 14B.

Also, the planar size of the resin sheet 342 is such that the resin sheet 342 coats the semiconductor wafer 320 having the semiconductor element unit 322 (see FIG. 15A) configured thereon, and the size of the resin sheet 342 is set smaller than the overall size of the semiconductor wafer 320. Therefore, the bottom surface of the peripheral edge of the semiconductor wafer 320, on which the semiconductor element unit 322 is not formed, is not coated with the resin sheet 342.

Here, in this process, an upper end of the external connection electrode 316 formed on the top surface of the semiconductor wafer 320 is in contact with an inner wall of the upper die 332. Here, in order to prevent the external connection electrode 316 from becoming damaged or deformed, a protective sheet made of resin may be used to coat an inner side wall of the upper die 332 and thereby bring the upper end of the external connection electrode 316 into contact with the protective sheet.

Figure 17A:
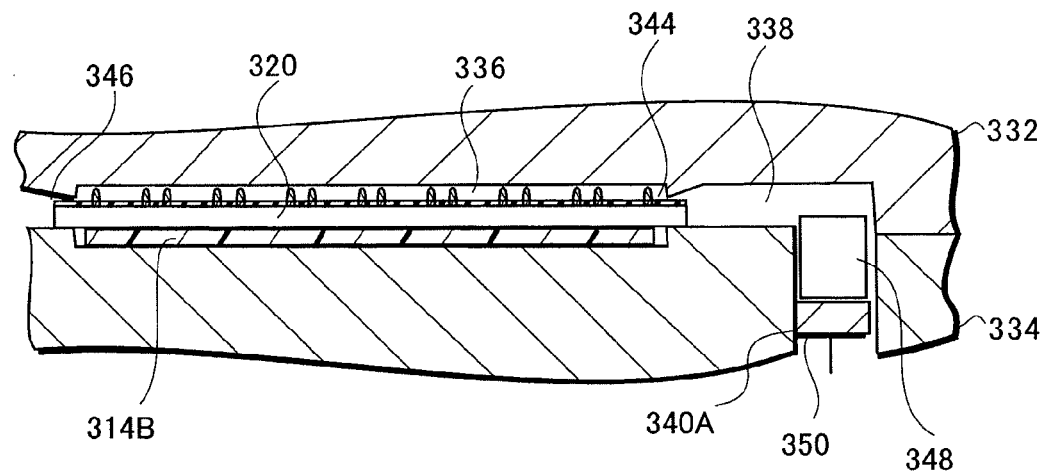
FIGS. 17A and 17B are cross-sectional views showing the circuit device manufacturing method according to the present invention.

Referring to FIG. 17A, then, the sealing resin is injected into the cavity 336. Specifically, a tablet 348 is loaded into a pod 340A provided in the lower die 334 and is heated and melted therein, and subsequently, the tablet 348 is pressed by a plunger 350. The tablet 348 has the same composition as the above-mentioned resin sheet 342, and is obtained by pressure-molding a thermosetting resin in powder form having an additive such as a filler mixed therein, into a cylindrical form. As mentioned above, the molding die is heated to about 170° C. or higher, and thus, when the tablet 348 is loaded into the pod 340A, the tablet 348 is gradually melted. The molten sealing resin in liquid or semisolid form flows through a runner 338 and passes through a gate 344, and is then fed to the cavity 336. With the feeding of the resin, the air in the cavity 336 is released to the outside via an air vent 346. Hereinafter, the sealing resin fed through the gate 344 is called the first sealing resin 314A, and the sealing resin made of the molten resin sheet 342 is called the second sealing resin 314B.

Figure 17B:
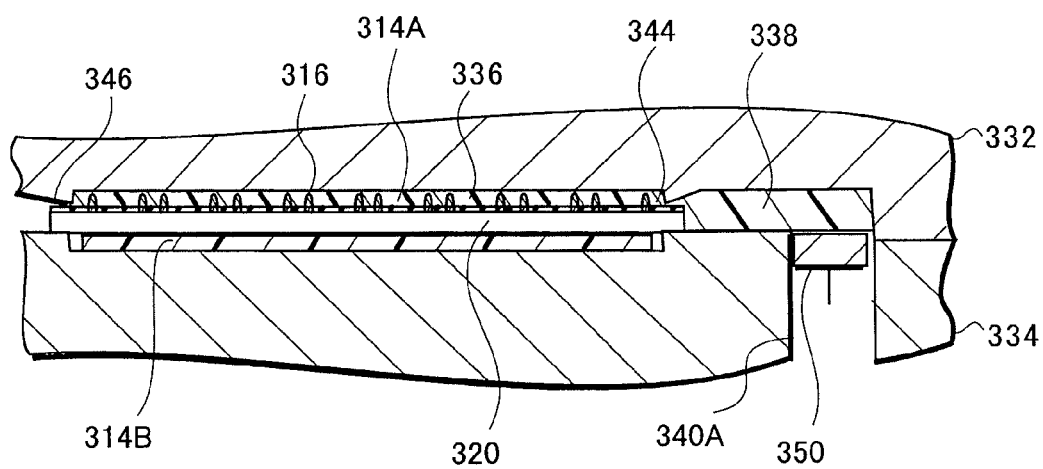

Referring to FIG. 17B, the injected first sealing resin 314A in liquid form is filled into the cavity 336. Specifically, the top surface of the semiconductor wafer 320 and the side surface of the external connection electrode 316 are coated with the injected first sealing resin 314A. Here, the temperature of the molding die is higher than a temperature at which the first sealing resin 314A is heat-cured, and thus, the first sealing resin 314A and the second sealing resin 314B filled into the cavity 336 are polymerized and cured with the passage of time.

When both the first sealing resin 314A and the second sealing resin 314B are sufficiently polymerized and heat-cured by being heated in the molding die, the upper die 332 and the lower die 334 are separated from each other, and the semiconductor wafer 320 coated with the resins 314A and 314B is removed. In this process, the molding die 330 is used to form the second sealing resin 314B, and thus, the bottom surface of the semiconductor wafer 320 can be accurately, evenly sealed with the resin in a predetermined thickness.

Further, here, this process may be such that the first sealing resin 314A is formed so as to coat the top surface of the semiconductor wafer 320, also inclusive of the upper end of the external connection electrode 316, and after the completion of the sealing process, a grinding process is performed on the top surface of the first sealing resin 314A thereby to expose the external connection electrode 316 to the outside from the first sealing resin 314A.

Figure 18:
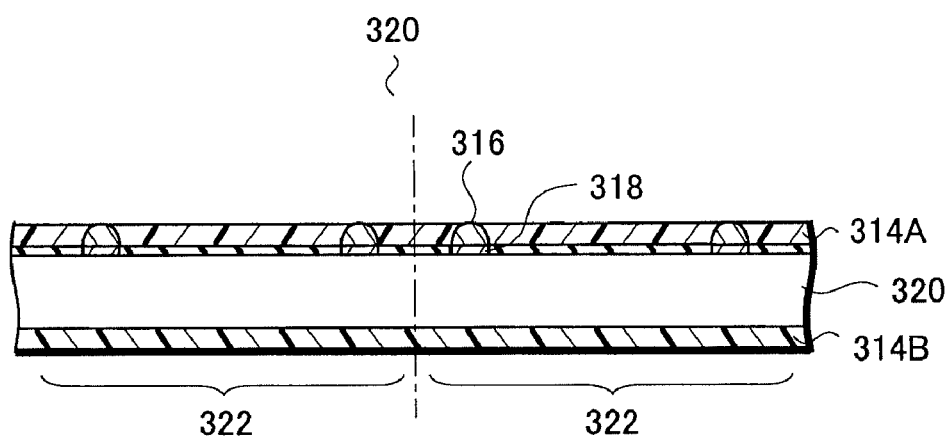
FIG. 18 is a cross-sectional view showing the circuit device manufacturing method according to the present invention.
Figure 19A:
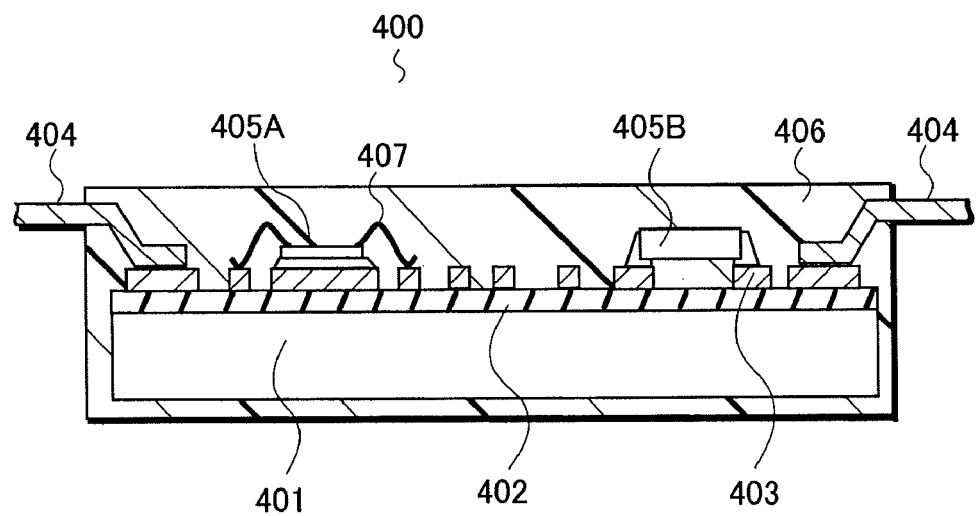
FIGS. 19A and 19B are cross-sectional views showing a conventional hybrid integrated circuit device.
Figure 19B:
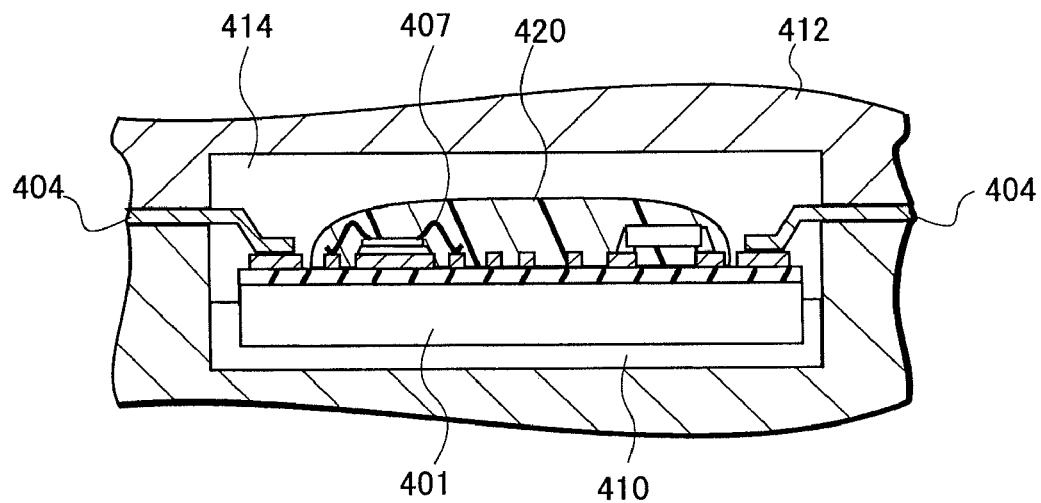

Referring to FIG. 18, then, the semiconductor wafer 320 coated with the sealing resin by the above-mentioned process is divided into individual circuit devices by dicing. Here, the semiconductor wafer 320, the first sealing resin 314A and the second sealing resin 314B are cut by the dicing along the dicing line defined by a chain line between the semiconductor element units 322. Further, here, grooves may be formed in the top and bottom surfaces of the semiconductor wafer 320 on a region corresponding to the boundary between the semiconductor element units 322. This has the advantages of facilitating the dicing in this process.

In this process, the principal surfaces of the semiconductor wafer 320 are coated with the first sealing resin 314A and the second sealing resin 314B, and thus, the effect of suppressing chipping at the time of the dicing is achieved.

By the above-described process, the circuit device 310 shown in FIGS. 14A and 14B is manufactured.

What is claimed is:

1. A method of manufacturing a circuit device, comprising:
   attaching a hybrid integrated circuit comprising a conductive pattern and a circuit element to a top surface of a circuit board; and
   sealing top and side surfaces of the circuit board with a sealing resin containing a thermosetting resin by injecting the sealing resin into a cavity of a molding die in which the circuit board is placed,
   wherein the sealing comprises coating a bottom surface of the circuit board with a molten resin sheet containing a thermosetting resin simultaneously during the sealing, the resin sheet being interposed between the circuit board and a bottom surface of an inner wall of the molding die.

2. The method of claim 1, wherein during the sealing, the resin sheet is pressed against and thereby fixed to the bottom surface of the circuit board while leads led out of opposite side edges of the circuit board are sandwiched by the molding die, and a thickness of the sealing resin made of the molten resin sheet, coating the bottom surface of the circuit board, is less than that of the resin sheet.

3. The method of claim 1, wherein during sealing, the resin sheet is melted, and thereafter, the sealing resin in liquid form is injected into the cavity through a gate of the molding die, and the resin sheet is heat-cured prior to the sealing resin that is injected.

4. The method of claim 3, wherein the resin injected into the cavity through the gate of the molding die has the same composition as the resin sheet.

5. The method of claim 3, wherein fillers contained in the sealing resin which is made of the molten resin sheet and coats the bottom surface of the circuit board, is more uniformly dispersed than fillers contained in the sealing resin which is injected through the gate and coats the top surface of the circuit board.

6. The method of claim 1, wherein the resin sheet is made by pressure-molding the thermosetting resin in powder form yet to be heat-cured.

7. The method of claim 1, wherein the resin sheet is formed in size larger than the circuit board, and an entire area of the bottom surface of the circuit board is coated with the resin sheet.

8. The method of claim 1, wherein the sealing comprises coating the bottom surface of the circuit board with two or more molten resin sheets containing the thermosetting resin.

9. A method of resin-sealing a circuit element disposed on a circuit board or an island of a lead frame using a molding die, comprising:
   providing a resin sheet formed by pressure-molding a resin material in powder form and containing a thermosetting resin;
   placing the resin sheet in a cavity of the molding die so as to be under the circuit board or the island on which the circuit element is disposed; and
   sealing the circuit element with a sealing resin and by simultaneously melting the resin sheet.

10. The method of claim 9, wherein, during the sealing, a pellet obtained by pressure-molding the resin material in the powder form is melted by heat and is injected into the cavity so that the molten pellet and the resin sheet form the sealing resin, and the resin sheet is formed thinner than the pellet.

11. The method of claim 9, wherein the percentage of filling of the resin sheet is equal to or more than 99%.

12. The method of claim 9, wherein a thickness of the resin sheet is equal to or less than 0.6 mm.

13. The method of claim 9, wherein, during the sealing, the resin sheet is placed between the circuit board and an inner wall of the molding die, and the resin sheet is melted and heat-cured so as to coat a bottom surface of the circuit board.

14. The method of claim 9, wherein, during the sealing, the resin sheet is placed between the island and an inner wall of the molding die, and the resin sheet is melted and heat-cured so as to coat a bottom surface of the island.

15. A method of manufacturing a circuit device, comprising:
   providing a semiconductor wafer comprising a plurality of semiconductor element units and external connection electrodes that are formed on a top surface of the wafer, the external connection electrodes being connected to the semiconductor element units;
   sealing the top surface of the semiconductor wafer with a resin; and
   dividing the semiconductor wafer into the semiconductor element units,
   wherein, during the sealing, a resin sheet containing a thermosetting resin is melted so as to coat a bottom surface of the semiconductor wafer.

16. The method of claim 15, wherein a molding die is used in the sealing, the resin sheet is placed and melted between the bottom surface of the semiconductor wafer and an inner wall of the molding die, and the top surface of the semiconductor wafer is coated with a resin injected into a cavity of the molding die.

17. The method of claim 16, wherein the resin injected into the cavity of the molding die has the same composition as the resin sheet.

18. The method of claim 15, wherein the resin sheet is made by pressure-molding the thermosetting resin in powder form yet to be heat-cured.

* * * * *